(12) United States Patent
Kusuda et al.

(10) Patent No.: US 6,614,055 B1
(45) Date of Patent: Sep. 2, 2003

(54) SURFACE LIGHT-EMITTING ELEMENT AND SELF-SCANNING TYPE LIGHT-EMITTING DEVICE

(75) Inventors: Yukihisa Kusuda, Osaka (JP); Seiij Ohno, Osaka (JP); Shunsuke Ohtsuka, Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 6 days.

(21) Appl. No.: 09/710,246

(22) Filed: Nov. 10, 2000

Related U.S. Application Data

(62) Division of application No. 09/043,106, filed as application No. PCT/JP96/02744 on Sep. 24, 1996, now Pat. No. 6,180,960.

(30) Foreign Application Priority Data

Sep. 25, 1995 (JP) ............................... 7-245835
Apr. 12, 1996 (JP) ............................... 8-089836

(51) Int. Cl.[7] ..................... H01L 29/74; H01L 33/00
(52) U.S. Cl. ................ 257/79; 257/107; 257/91; 257/99; 257/113; 257/116; 257/117; 257/118; 257/918
(58) Field of Search ............... 257/91, 107, 99, 257/113, 116, 117, 118, 918, 79

(56) References Cited

U.S. PATENT DOCUMENTS 4,864,370 A  9/1989  Gaw et al.
4,984,035 A  1/1991  Kanzawa et al.

FOREIGN PATENT DOCUMENTS

| EP | 0 335 553 A2 | 10/1989 |
| EP | 0 544 512 A1 | 6/1993 |
| JP | 2263668 | 10/1990 |
| JP | 3055885 | 3/1991 |
| JP | 4260217 | * 9/1992 |
| JP | 9283801 | * 4/1996 |

OTHER PUBLICATIONS

Proposal of Self–Scanning Light Emitting Device (SLED) K. Kusuda, K Tone, S. Tanaka, K. Yamashita, H. Nagata and N. Komaba, IEEE, Dec. 3, 1989, pp. 851–854.

* cited by examiner

Primary Examiner—Minh Loan Tran
Assistant Examiner—Tan Tran
(74) Attorney, Agent, or Firm—RatnerPrestia

(57) ABSTRACT

A surface light-emitting element having improved external light emission efficiency and a self-scanning light-emitting device using this surface light-emitting element are provided. To improve external light-emission efficiency, the light-emitting center is shifted to an area where there is no light shielding layer thereon. When the surface light-emitting element is a surface light-emitting thyristor of the PNPN structure, it is necessary to have such a construction that part of the injected current is prevented from flowing toward the gate electrode to improve external light emission efficiency. The self-scanning light-emitting device of this invention is accomplished by using this type of surface light-emitting element.

12 Claims, 15 Drawing Sheets

SURFACE LIGHT-EMITTING ELEMENT AND SELF-SCANNING TYPE LIGHT-EMITTING DEVICE

This application is a Divisional Application, claiming the benefit of U.S. patent application Ser. No. 09/043,106, filed Nov. 4, 1998, which is a U.S. National Phase Application of PCT International Application PCT/JP96/02744 filed Sep. 24, 1996.

TECHNICAL FIELD

The present invention relates to a surface light-emitting element, a structure for increasing the external light emission efficiency of surface light-emitting elements such as surface light-emitting thyristors, and a self-scanning type light-emitting device using such surface light-emitting elements.

BACKGROUND ART

Light-emitting diodes and laser diodes have heretofore been known as typical surface light-emitting elements. Light-emitting diodes rely on a light-emitting phenomenon where light is generated by the recombination of holes and electrons as carriers are injected into the PN or PIN junction formed on a compound semiconductor (GaAs, GaP, GaAlAs, etc.) by forward-biasing the junction. The laser diode, on the other hand, has a construction in which a waveguide is provided inside the light-emitting diode. When a current of a level exceeding a given threshold value is fed, the injected electron-hole pairs increase, causing a reversed distribution that leads to the amplification (gain) of photons due to stimulated emission. With this, laser oscillation takes place as the light generated by parallel reflex mirrors, such as planes of cleavage, is fed back again to the active layer. As a result, laser light is emitted from the end face of the waveguide.

Negative resistance elements having a light-emitting function (light-emitting thyristors, laser thyristors, etc.) are also known as light-emitting elements having a light-emitting mechanism similar to light-emitting diodes and laser diodes. Light-emitting thyristors are of the PNPN structure formed on a compound semiconductor as described above, and have been commercially available as silicon thyristors. These devices are described in detail in pp. 167–169, "Light-emitting Diodes" (edited by Masaharu Aoki; Kogyo Chosakai Publishing Co., Ltd.), for example. The basic construction of the negative resistance element having a light-emitting function (hereinafter referred to as light-emitting thyristor is exactly the same as that of the thyristor in that a PNPN structure is formed on an N-type GaAs substrate. Its current-voltage characteristic exhibits exactly the same S-shaped negative resistance characteristic as with the thyristor.

The present applicant has already disclosed self-scanning type light-emitting devices using a surface light-emitting type thyristor (hereinafter referred to as surface light-emitting thyristor) in his patent applications, such as Japanese Laid-Open Patent Publication No. Hei-2(1990)-263668, "Light-emitting device"; Japanese Laid-Open Patent Publication No. Hei-2(1990)-212170, "Light-emitting element array and method of driving same"; Japanese Laid-Open Patent Publication No. Hei-3(1991)-55885, "Light-emitting and light-receiving module"; Japanese Laid-Open Patent Publication No. Hei-3(1991)-200364, "Method of reading optical signals and switching element array to be used for same"; Japanese Laid-Open Patent Publication No. Hei-4(1992)-23367, "Light-emitting device"; and Japanese Laid-Open Patent Publication No. Hei-4(1992)-296579, "Method of driving light-emitting element array".

Surface light-emitting elements, such as surface light-emitting diodes and surface light-emitting thyristors, have a problem of poor external light emission efficiency because the light-emitting center is located beneath the electrode for injecting current, making the electrode itself a light shielding layer. This problem will be described in the following, taking the surface light-emitting thyristor as an example.

FIGS. 1A and 1B are a cross-sectional and plan views, respectively, showing a conventional surface light-emitting thyristor of the mesa type PNP structure. Note that these drawings are shown schematically to facilitate the understanding of the construction. This surface light-emitting thyristor comprises an N-type semiconductor layer 24 formed on an N-type semiconductor substrate 1, a P-type semiconductor layer 23, an N-type semiconductor layer 22, a P-type semiconductor layer 21, an anode electrode 40 formed in a such a manner as to make ohmic contact with the P-type semiconductor layer 21, and a gate electrode 41 in such a manner as to make ohmic contact with the N-type semiconductor layer 22. Though not shown in the figure, a cathode electrode is provided on the bottom surface of the substrate 1. On the entire structure shown in FIG. 1A provided is an insulating film (not shown) made of a light-transmitting, insulating material, on which an Al wiring 140 (see FIG. 1B) is provided. In the insulating film provided is a contact hole C for electrically connecting the electrode 40 and the Al wiring 140. Another contact hole (not shown) is provided in the insulating film on the gate electrode 41 for connecting the electrode to another Al wiring.

In this surface light-emitting thyristor of the PNPN structure, most of the current fed from the anode electrode 40 flows directly downward, as shown by an arrow in FIG. 1A (indicated by $I_1$.) The light-emitting center of the gate layers 22 and 23 therefore lies beneath the electrode 40. Because of this, light is shielded by the electrode 40 itself and by the Al wiring 140, lowering the external light emission efficiency.

The amount of light emitted is large in areas near the electrode 40 because of the high density of injected current there, while the corresponding amount is reduced in areas far away from the electrode 40 because the density of injected light becomes smaller. This is one of factors contributing to lowered external light emission efficiency.

Another factor responsible for lowered external light emission efficiency is that part of current injected from the anode electrode 40 flows going round to the gate electrode 41 (indicated by $I_2$). The light emitted by the current $I_2$ cannot be used because it is inclined toward the gate electrode 41. As a result, the amount of light obtained in areas near the anode electrode 40 is reduced.

Japanese Examined Patent Publication No. Hei-5(1993)-25189 discloses a conventional technique of enhancing external light emission efficiency in which the shape of the light-emitting surface of each light-emitting diode in a monolithic light-emitting diode array is made into a U shape by drawing current-feeding wiring to the central part of the light-emitting surface of each light-emitting diode. In this prior-art, however, external light emission efficiency cannot be improved materially because the light-emitting center still lies beneath the electrode.

Japanese Laid-Open Patent Publication No. Hei-4(1992)-259263 discloses a technique of improving light emission efficiency in which the light-emitting region of the active layer in a semiconductor light-emitting element is expanded to a sufficient degree so that the light from the light-emitting region can be extracted without shielding with the electrode on the light extracting side. But the structure and manufacturing method of semiconductor in this technique are considerably complex.

Japanese Laid-Open Patent Publication No. Hei-5(1993)-211345 also discloses a technique of improving external light emission efficiency in a surface light-emitting diode that emits light from a light extracting surface by stacking P-type semiconductors and N-type semiconductors on a substrate, forming a light extracting surface on the topmost part of the stacked semiconductors, and feeding a working current between an upper electrode installed on the light extracting surface and a lower electrode installed on the bottom surface of the substrate, thereby the concentration of impurities at portions other than the portion beneath the upper electrode in a plane parallel with the light extracting surface to form a current control layer that allows the working current to flow easily in the portions other than the portion beneath the upper electrode. In this technique, however, manufacturing process becomes complex.

DISCLOSURE OF THE INVENTION

It is an object of this invention to provide a surface light-emitting element requiring no complicate construction nor complex manufacturing process and having improved external light emission efficiency.

It is another object of this invention to provide a self-scanning type light-emitting device using such surface light-emitting elements.

There are the following three methods of improving external light emission efficiency in surface light-emitting elements, such as surface light-emitting diodes and surface light-emitting thyristors.

(1) The light-emitting center is moved to a position having no light-shielding layer thereabove. To this end, an insulating layer is provided on the electrode region having a light shielding layer thereabove at a portion making contact with the lower semiconductor layer so as to prevent the injected current from flowing from that electrode region.

(2) The peripheral length of the electrode is increased to increase the amount of light emission. With an electrode of the same area, the larger the peripheral length, the more uniformly the current injected from the electrode is distributed and the more uniformly the light is emitted. Thus, the amount of light emission is increased.

(3) When the surface light-emitting element is a surface light-emitting thyristor of a PNPN structure, the construction of the surface light-emitting element should be such that part of the injected current does not flow going round to the gate electrode.

This invention is characterized in that external light emission efficiency is improved, in a surface light-emitting element having a light-emitting layer, an electrode provided on the light-emitting side of the light-emitting layer for injecting current into the light-emitting layer, and a wiring connected to the electrode, by extending the electrode to a region on the light-emitting layer that is not covered by the wiring, and providing an insulating layer under a portion of the electrode covered by the wiring.

The surface light-emitting element of this invention comprises a slender electrode provided on the light-emitting side of the light-emitting layer for injecting current into the light-emitting layer, a first wiring connected to one end of the electrode, a second wiring connected to the other end of the electrode, a first insulating layer provided under an area of the one end of the electrode covered by the first wiring, and a second insulating layer provided under an area of the other end of the electrode covered by the second wiring, and is characterized in that external light emission efficiency is improved and the variation of the external light emission efficiency is eliminated.

This invention is characterized in that external light emission efficiency is improved in a surface light-emitting element comprising a light-emitting layer, an electrode provided on the light-emitting side of the light-emitting layer for injecting current into the light-emitting layer, and a wiring connected to the electrode straddling a certain side of the electrode by providing an insulating layer under the electrode in such a manner as to lie under the inside of the remaining sides, other than the certain side, of the electrode.

This invention is characterized in that external light emission efficiency is improved in a surface light-emitting element comprising at least two semiconductor layers and including a light-emitting layer by providing an electrode that makes ohmic contact with the light-emitting-side semiconductor layer, a metallic layer that makes ohmic contact with the electrode and Schottky contact with the light-emitting-side semiconductor layer; the electrode extending to a region not covered with the wiring of the light-emitting-side semiconductor layer, by injecting current into the light-emitting layer from the metallic layer via the electrode.

This invention is characterized by a surface light-emitting element comprising a light-emitting layer, an electrode provided on the light-emitting side of the light-emitting layer for injecting current into the light-emitting layer, and a wiring connected to the electrode in which at least part of the peripheral shape of the electrode is of an irregular planar shape to increase the peripheral length of the electrode.

This invention is a self-canning, light-emitting device using surface light-emitting elements of the aforementioned construction, or more specifically a self-scanning type light-emitting device in which a plurality of light-emitting elements having control electrodes with a threshold voltage or a threshold current for light emitting operation are arranged; the control electrode of each light-emitting element being connected to the control electrode of at least one light-emitting element located in the vicinity thereof via a connecting resistor or an electrically unidirectional electrical element, and a plurality of wirings for applying voltage or current from outside are connected to the electrodes for controlling the light emission of each light-emitting element.

BEST MODE FOR CARRYING OUT THE INVENTION

In the following, embodiments of this invention will be described with reference to a surface light-emitting thyristor of a PNPN structure. Note that this invention can be applied not only to surface light-emitting thyristors but also generally to surface light-emitting elements, including surface light-emitting diodes.

Embodiment 1

Figure 2A:
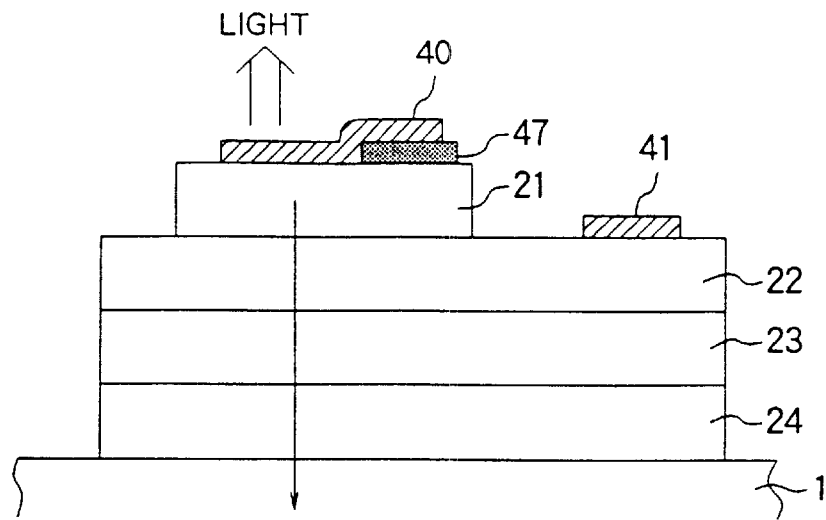
FIGS. 2A and 2B are diagrams illustrating the construction of a surface light-emitting thyristor in Embodiment 1 of this invention.
Figure 2B:
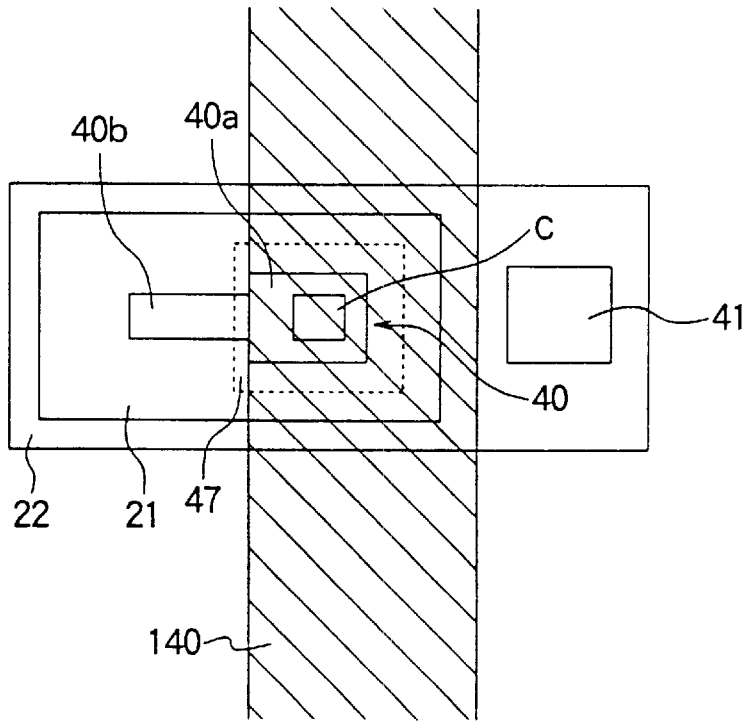

FIGS. 2A and 2B are cross-sectional and plan views, respectively, of a surface light-emitting thyristor embodying this invention.

Figure 1A:
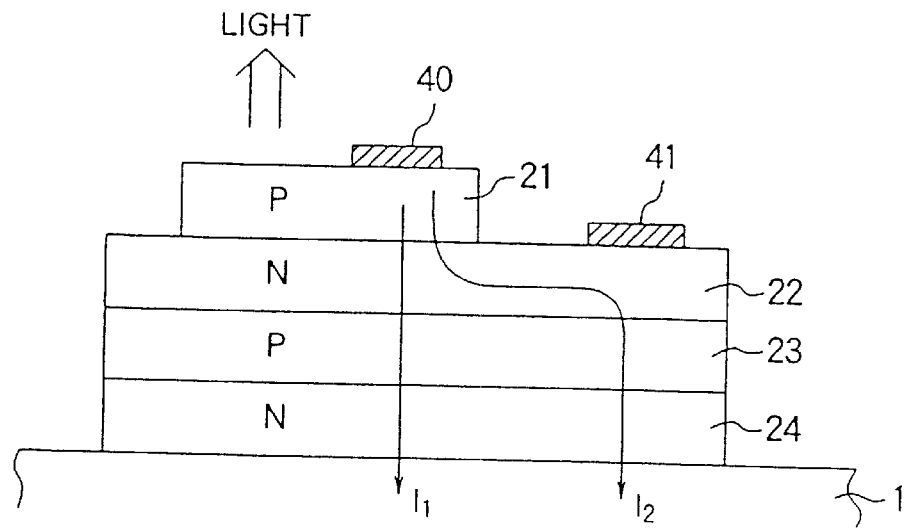
FIGS. 1A and 1B are diagrams illustrating the construction of a conventional surface light-emitting thyristor.
Figure 1B:
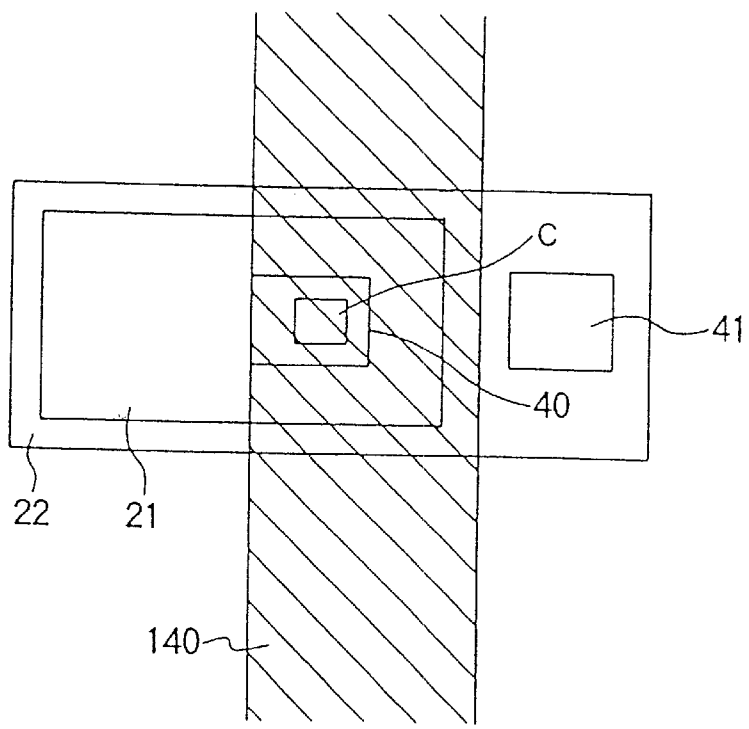

This surface light-emitting thyristor element has such a construction that the anode electrode of the surface light-emitting thyristor of FIGS. 1A and 1B is a T-shaped electrode (made of Au) consisting of portions 40a and 40b, with an insulating layer provided under the electrode portion 40a. The electrode portion 40a is of a rectangular shape, and the electrode portion 40b is of a slender rectangular shape. Only the electrode portion 40b makes ohmic contact with the P-type semiconductor layer 21. The electrode portion 40a corresponds to the electrode 40 of the conventional construction as shown in FIGS. 1A and 1B. The construction of this embodiment is such that the electrode portion 40b is added to the conventional construction shown in FIGS. 1A and 1B. The size of the electrode portion 40a is 7 $\mu$m×11 $\mu$m and that of the electrode portion 40b is 4 $\mu$m×12 $\mu$m, for example.

Although a layer 47 made of an insulating material is provided under the electrode portion 40a, this insulating material may be any material, such as $SiO_2$, SiN, SiON, $Al_2O_3$, $TiO_2$, so long as it can be processed in any desired patterns. The size of this insulating layer 47 is 14 $\mu$m×16 $\mu$m, for example. The electrode 40a is electrically connected to the Al wiring 140 via a contact hole C provided in a light-transmitting insulating film (not shown).

Other structural features are the same as those of the surface light-emitting thyristor shown in FIGS. 1A and 1B. Like components in FIGS. 2A and 2B are therefore indicated by like reference numerals in FIGS. 1A and 1B.

In the surface light-emitting thyristor of such a construction having the insulating layer 47 under the electrode portion 40a with the contact hole C, current does not flow down immediately below the electrode portion 40a, but flows from the electrode portion 40b to the semiconductor layer at the lower part, as shown by an arrow in FIG. 2A. The light-emitting center therefore lies beneath the electrode portion 40b, shifting leftward in the figure, compared with the surface light-emitting thyristor shown in FIGS. 1A and 1B.

According to the surface light-emitting thyristor of this invention, the electrode portion 40b blocking the incidence of light is smaller than the electrode 40 shown in FIGS. 1A and 1B, and there is no Al wiring 140 above the light-emitting center. As a result, external light emission efficiency with this construction be improved better than with the conventional construction. It can be improved about twice from 30 $\mu$W to 70 $\mu$W, for example.

Embodiment 2

Figure 3A:
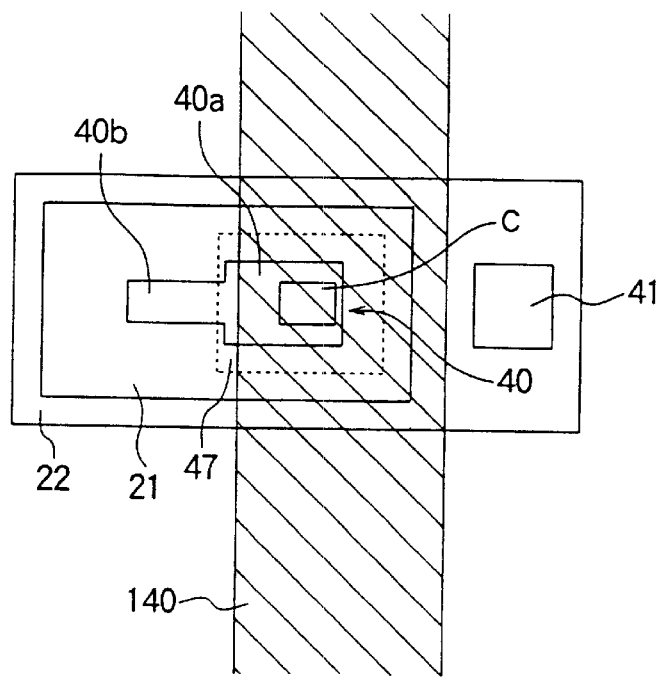
FIGS. 3A and 3B are diagrams illustrating the shifting of the electrode.
Figure 3B:
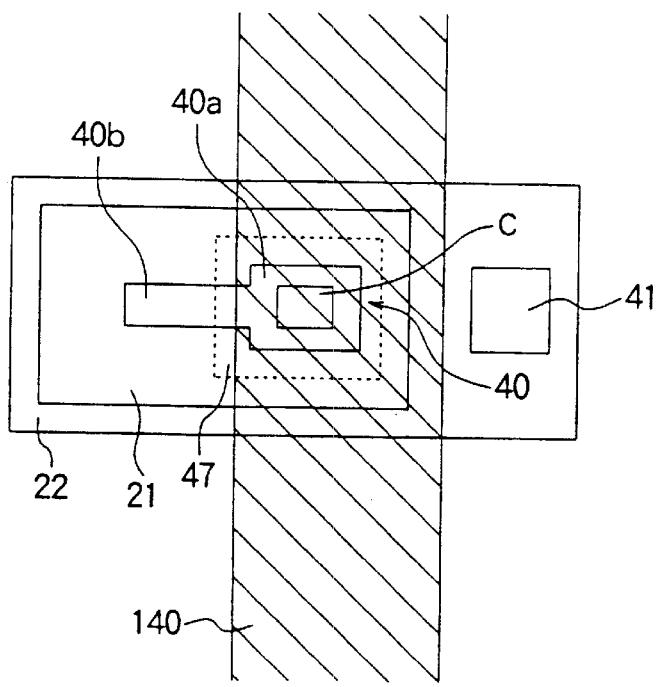

When manufacturing the surface light-emitting thyristor of Embodiment 1, the T-shaped electrode 40 can be formed by vapor deposition using a mask having a pattern with openings. If the mask position is shifted, the electrode 40 may be formed at a position shifted away from the designed position. FIG. 3A shows the case where the electrode 40 is shifted leftward in the figure, while FIG. 3B shows the case it is shifted right-ward. If this shifting occurs, a difference may be caused in the area of the electrode portion 40b making ohmic contact with P-type semiconductor layer 21. That is, the contact area in FIG. 3A is larger than the contact area in FIG. 3B. The current flowing from the electrode increases with increasing in the area of ohmic contact. Consequently, a shift in the position of the electrode 40 may cause variability in external light-emission efficiency. When a self-scanning type light-emitting device having an array of a plurality of surface light-emitting thyristors with variability in external light emission efficiency is used in an optical printer, printing quality would deteriorate.

Figure 4A:
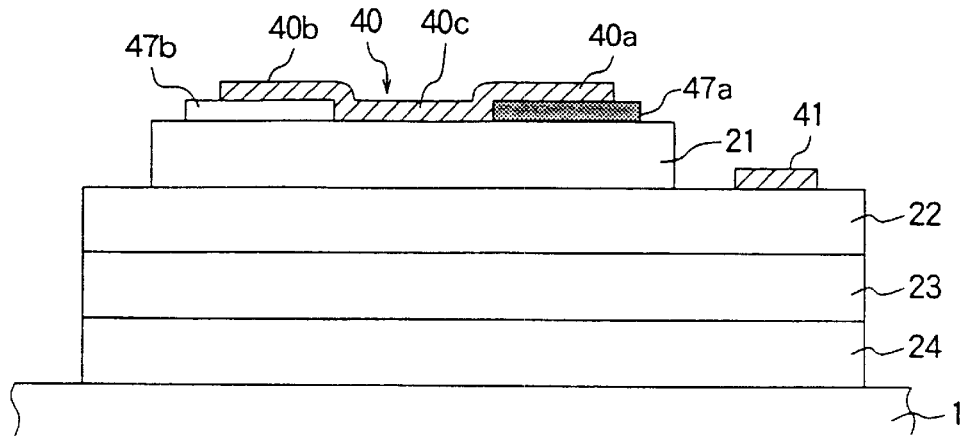
FIGS. 4A and 4B are diagrams illustrating the construction of a surface light-emitting thyristor in Embodiment 2 of this invention.
Figure 4B:
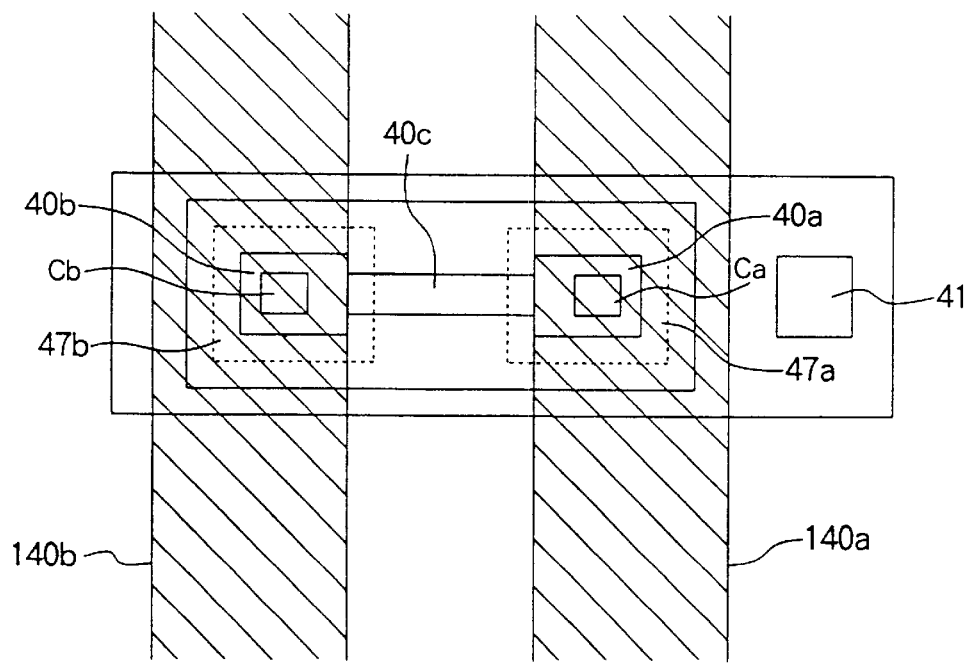

Thus, surface light-emitting thyristors having no variability in external light emission efficiency is desired. Another embodiment of the surface light-emitting thyristor element having no variability in external light emission efficiency is shown in FIGS. 4A and 4B. FIG. 4A is a cross-sectional view, and FIG. 4B a plan view.

An anode electrode 40 in this embodiment is of an H-shaped electrode consisting of electrode portions 40a and 40b, and an electrode portion 40c between the electrode portions 40a and 40b, with insulating layers 47a and 47b provided under the electrode portions 40a and 40b. The electrode portion 40a is of a rectangular shape and the electrode portion 40b of a slender rectangular shape.

The size of the electrode portions 40a and 40b is 7 μm×11 μm, and that of the electrode portion 40c is 4 μm×20 μm. The size of the insulating layers 47a and 47b under the electrode portions 40a and 40b is 14 μm×16 μm.

In FIGS. 4A and 4B, like components are indicated by like numerals in FIGS. 1A and 1B.

In the construction shown in FIG. 4A provided is an insulating film (that transmits light), though not shown in the figure, on which Al wirings 140a and 140b are provided. On the insulating film provided is a contact hole Ca for electrically connecting the electrode portion 40a and the Al wiring 140a, and a-contact hole Cb for electrically connecting the electrode portion 40b and the Al wiring 140b.

In the construction of this embodiment, the sizes of the electrode portions 40a and 40b, and the insulating layers 47a and 47b are selected taking into account the shifting of the mask during manufacture so that the electrode portions 40a and 40b protrude from the insulating layers 47a and 47b thereunder. Consequently, as the electrode portion making ohmic contact with the P-type semiconductor layer 21 is the electrode portion 40c, the area of the electrode portion making ohmic contact can be maintained almost constant. Thus, variability in external light emission efficiency can be eliminated.

Embodiment 3

Figure 5:
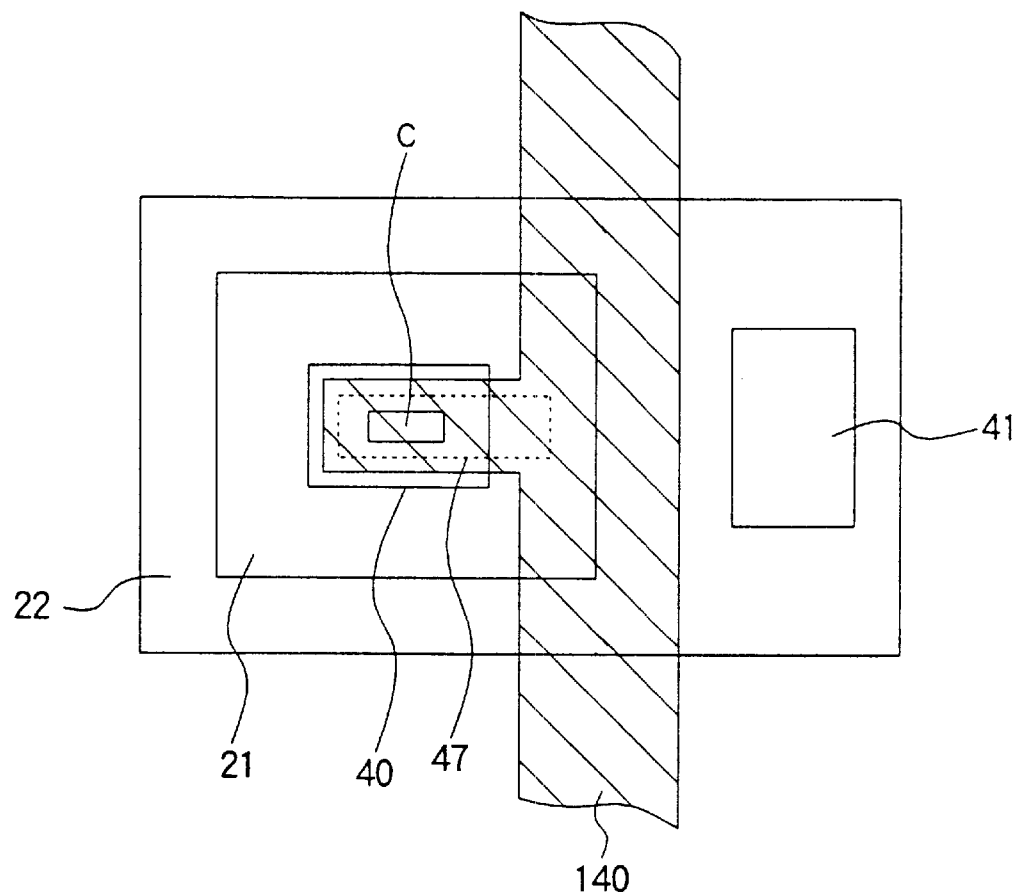
FIG. 5 is a diagram illustrating the construction of a surface light-emitting thyristor in Embodiment 3 of this invention.

This embodiment is a variety of Embodiment 1. Whereas the anode electrode of Embodiment 1 is of a T-shape and the electrode portion 40b of a slender rectangular shape, the anode electrode of this embodiment is of a rectangular shape having a wider width compared with the electrode portion 40b in Embodiment 1, as shown in FIG. 5, with the insulating layer 47 provided under the electrode 40. The insulating layer 47 is adapted so that it lies under the inside of the three sides but one of the electrode 40. To this end, the width of the insulating layer 47 is made smaller than the width of the anode electrode 40. More specifically, the size of the anode electrode 40 is 10 μm×14 μm, and that of the insulating layer 47 is 6 μm×20 μm. The electrode 40 is connected to the Al wiring 140 via the contact hole provided in an insulating film (not shown). This Al wiring extends over the electrode 40, straddling one side of the electrode 40, and the width of the Al wiring in this portion is made smaller than the width of the electrode 40.

In the surface light-emitting thyristor of this construction, current flows from the three sides at which the electrode 40 makes ohmic contact with the P-type semiconductor layer 21, emitting light. Although light emission efficiency is lowered compared with Embodiment 1, embodiment 3 has an advantage of avoiding concentration of current at the shouldered portion of the anode electrode with the insulating layer 47 thereunder.

Embodiment 4

Figure 6A:
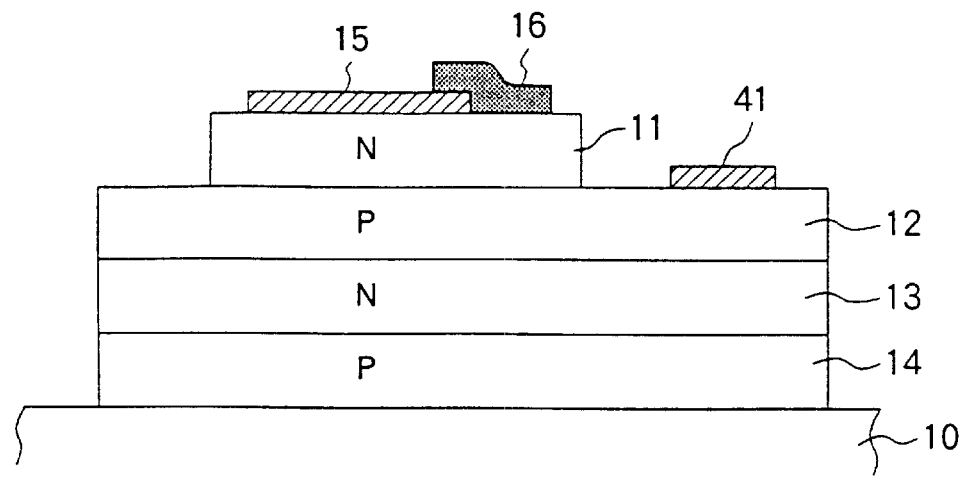
FIGS. 6A and 6B are diagrams illustrating the construction of a surface light-emitting thyristor in Embodiment 4 of this invention.
Figure 6B:
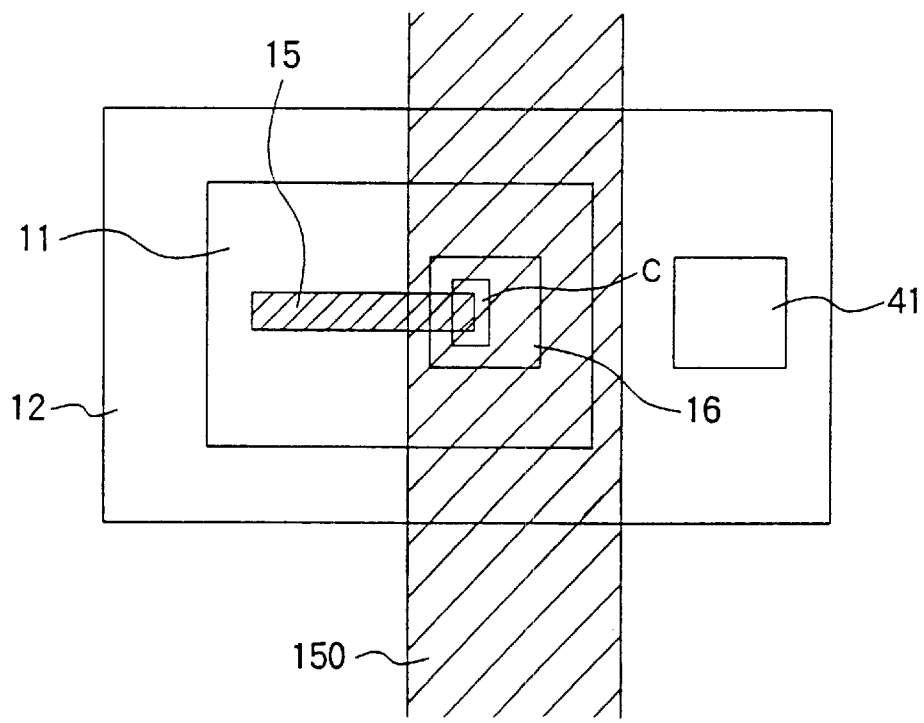

FIGS. 6A and 6B are cross-sectional and plan views of still another embodiment of the surface light-emitting thyristor of this invention. This surface light-emitting thyristor has a P-type semiconductor layer 14, N-type semiconductor layer 13, P-type semiconductor layer 12 and N-type semiconductor layer 11 formed on a P-type semiconductor substrate. On the N-type semiconductor layer 11 provided is a cathode electrode 15 making ohmic contact with the N-type semiconductor layer, and on the cathode electrode 15 and the N-type semiconductor layer 11 provided is a metallic layer 16 making Schottky contact with the N-type semiconductor layer.

The cathode electrode 15 is manufactured into three layers of AuGe (500 angstrom), Ni (100 angstrom), Au (1500 angstrom). As materials for the metallic layer 16, Au, Cr, Ti, W, Al and other metals can be used. AuZn is of a P-type that makes Schottky contact with an N-type semiconductor layer.

The cathode electrode 15 is of a slender rectangular shape (4 μm×20 μm, for example), and the metallic layer 16 is of a rectangular shape (12 μm×12 μm, for example). Though not shown in the figure, an insulating layer is formed on this structure, and an Al wiring 150 is provided on the insulating layer.

In the surface light-emitting thyristor of this construction, since the metallic layer 16 makes Schottky contact with the N-type semiconductor layer 11 thereunder, current is not injected from the metallic layer 16, and current is injected from a portion at which the rectangular cathode electrode 15 makes ohmic contact with the N-type semiconductor layer 11. Consequently, external light emission efficiency is improved with this construction of surface light-emitting thyristor, as with the surface light-emitting thyristor in Embodiment 1.

In the above embodiments, semiconductor layers are stacked on a P-type semiconductor substrate in the order of PNPN, but semiconductors may be stacked on an N-type semiconductor substrate in the order of NPNP. In this case, the anode layer becomes a P-type, and the anode electrode on the anode layer can be of a two-layer construction of AuZn (500 angstrom) and Au (1500 angstrom).

The surface light-emitting thyristor of this embodiment has an advantage in that it is easier to manufacture compared with Embodiments 1, 2 and 3 above.

Embodiment 5

Embodiments 1–3 relates to a construction where an insulating layer is provided under the electrode, and Embodiment 4 to a construction using a metallic layer making Schottky contact with the lower semiconductor layer. In this embodiment, external light emission efficiency is improved by increasing the peripheral length of an electrode by making the peripheral planar shape of the electrode into an irregular shape.

Figure 7A:
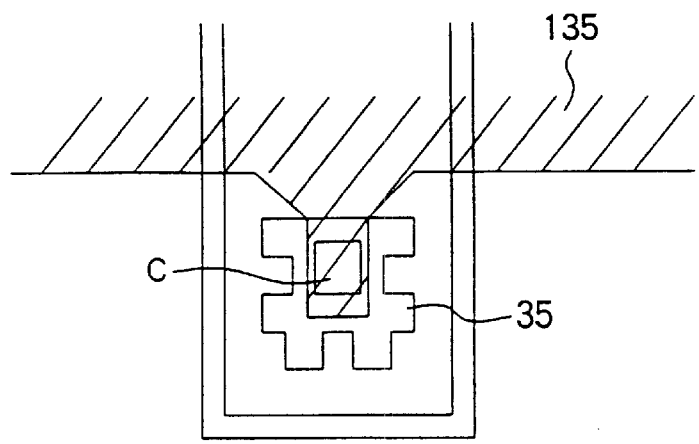
FIGS. 7A, 7B and 7C are diagrams illustrating the shape of the electrode of a surface light-emitting thyristor in Embodiment 5 of this invention.
Figure 7B:
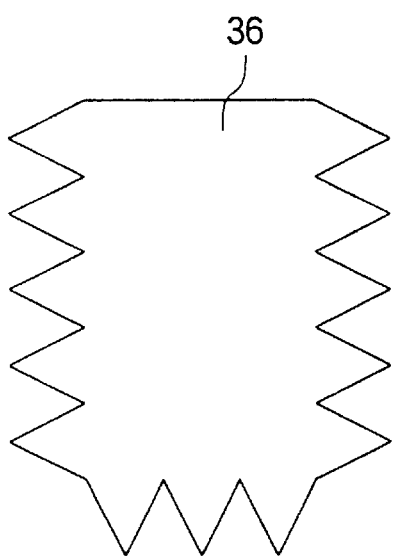
Figure 7C:
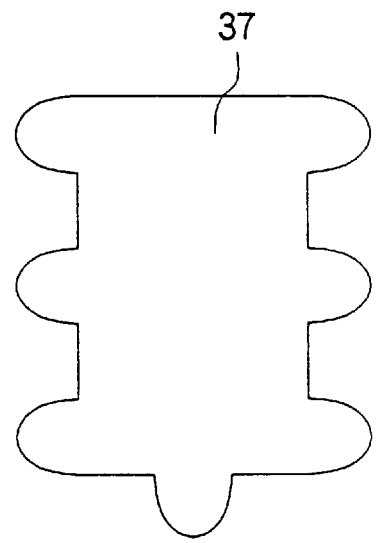

FIGS. 7A, 7B and 7C show examples of electrode shapes. FIG. 7A shows an electrode 35 of a shape having square projections protruded from the sides of a rectangle. The electrode 35 is connected to the Al wiring 135 via a through hole C provided in an insulating film (not shown).

FIG. 7B shows an electrode 36 of a shape having triangular projections on the sides of a rectangle.

FIG. 7C shows an electrode 37 of a shape having semi-spherical projections on the sides of a rectangle. By making the electrode into such shapes, its peripheral length is increased, and as a result the current injected from the electrode spreads uniformly over the entire surface, allowing light to emit evenly and thereby increasing the amount of light emission.

The shapes of the electrode in this embodiment can be adopted for the surface light-emitting thyristors of Embodiments 1–4.

Embodiment 6

Although the above embodiments are concerned with the construction and shape of the electrode, the following embodiments deal with a construction where part of the injected current is prevented from going round to the gate electrode in a surface light-emitting thyristor.

Figure 8A:
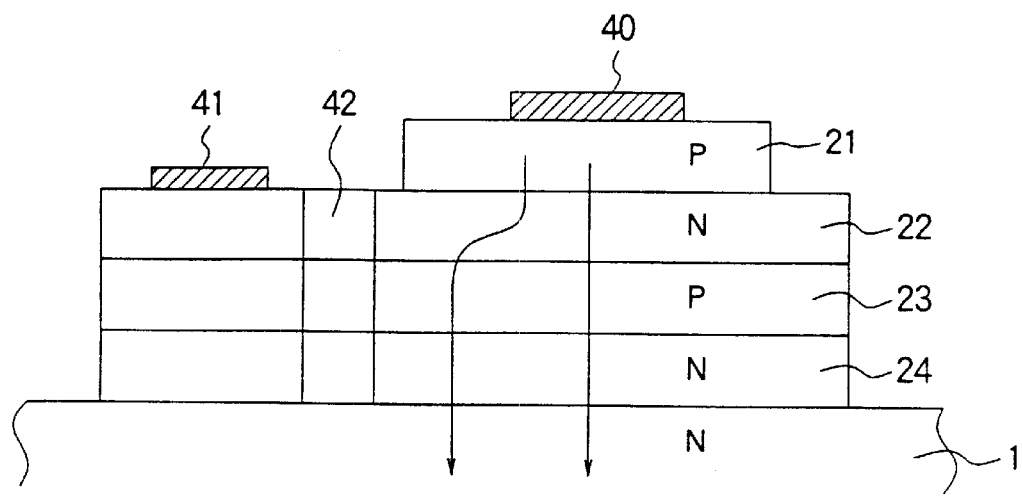
FIGS. 8A and 8B are diagrams illustrating the construction of a surface light-emitting thyristor in Embodiment 6 of this invention.
Figure 8B:
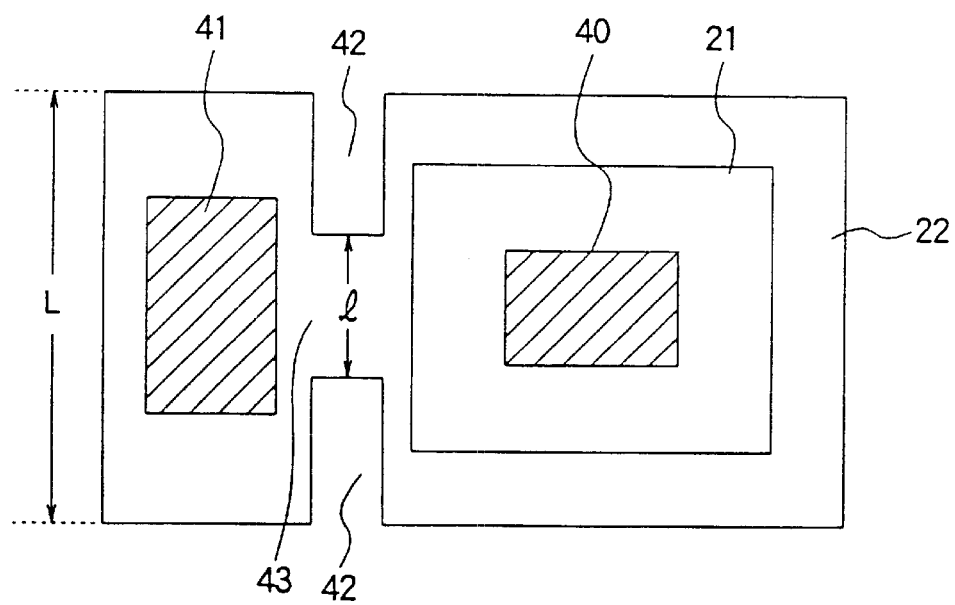

FIGS. 8A and 8B are side and plan views showing a surface light-emitting thyristor embodying this invention. In this surface light-emitting thyristor, an N-type semiconductor layer 24, P-type semiconductor layer 23, N-type semiconductor layer 22, and P-type semiconductor layer 21, all made of GaAs, are stacked in that order on an N-type semiconductor substrate 1 made of GaAs. An anode electrode 40 made of AuZn is formed on the P-type semiconductor layer 21, and a gate electrode 41 made of AuGeNi on the N-type semiconductor layer 22, and a cathode electrode (not shown) on the rear surface of the N-type substrate 1.

In the surface light-emitting thyristor of this embodiment, notches 42 are provided on both sides of the semiconductor layers 22, 23 and 24 between the anode electrode region and the gate electrode region to form a necked portion 43 on the semiconductor layers 22, 23 and 24. The notches 42 can be easily formed by etching.

Since the width $\lambda$ of the neck portion 43 is smaller than the width L, the resistance value of the neck portion 43 becomes larger. As a result, the current injected from the anode electrode 40 does not flow toward the gate electrode 41, as shown by an arrow in FIG. 8A, thus contributing more to light emission under the anode electrode 40. This construction therefore increases the amount of light emission compared with the conventional constructions. When L=26 $\mu$m, and $\lambda$=10 $\mu$m, the amount of light emission increases by about 10%.

Emission 7

Figure 9A:
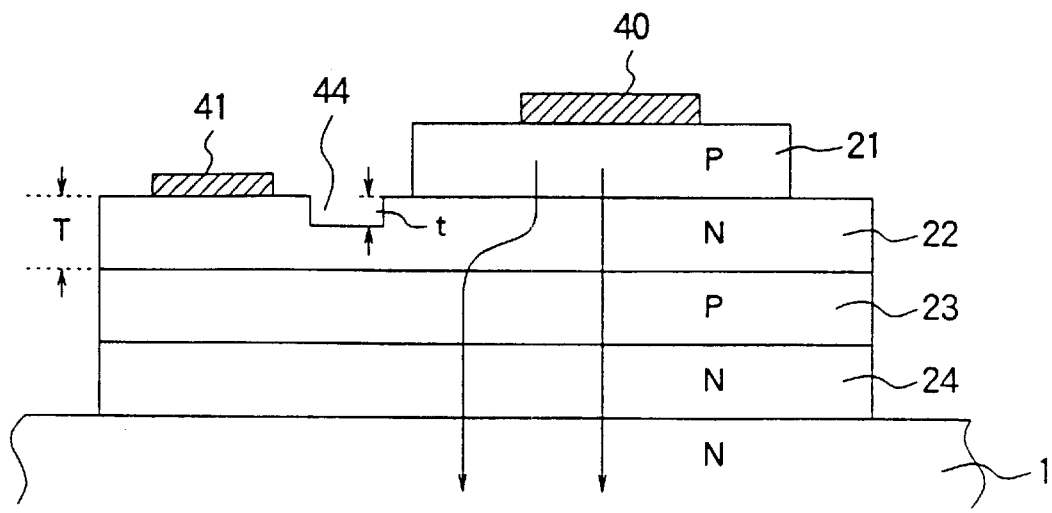
FIGS. 9A and 9B are diagrams illustrating the construction of a surface light-emitting thyristor in Embodiment 7 of this invention.
Figure 9B:
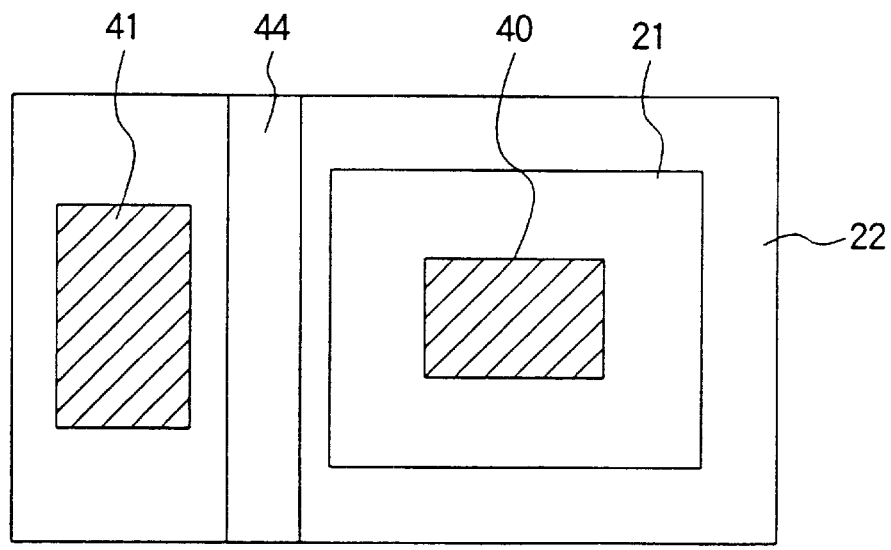

FIGS. 9A and 9B are side and plan views of a surface light-emitting thyristor embodying this invention. In this surface light-emitting thyristor, an N-type semiconductor layer 24, P-type semiconductor layer 23, N-type semiconductor layer 22 and P-type semiconductor layer 21, all made of GaAs, are stacked in that order on an N-type semiconductor substrate 1 made of GaAs. An anode electrode 40 made of AuZn is formed on the P-type semiconductor layer 21, and a gate electrode 41 made of AuGeNi on the N-type semiconductor layer 22, and a cathode electrode (not shown) on the rear surface of the N-type substrate 1.

According to the surface light-emitting thyristor of the invention, a groove 44 is provided on the semiconductor layer 22 between the anode electrode region and the gate electrode region. The depth of the groove is such that the groove is kept a certain distance away from a depletion layer formed between the N-type semiconductor layer 22 and the P-type semiconductor layer 23 without reaching the depletion layer. This is because if the groove reaches the depletion layer, the resistance value between the anode electrode 40 and the gate electrode 41 on the N-type semiconductor layer 22 becomes large, remarkably aggravating the electrical properties of the thyristor.

By providing the groove 44 of the above construction, the resistance value between the anode electrode region and the gate electrode region on the semiconductor layer 22 becomes large. As a result, the current injected from the anode electrode 40 does not flow toward the gate electrode, as shown by an arrow in FIG. 9A, contributing to light emission under the anode electrode 40. Consequently, the amount of light emission with this construction increases, compared with that with the conventional construction. When the thickness T of the semiconductor layer 22 is 1 $\mu$m and the depth of the groove 44 is 0.5 $\mu$m, the amount of light emission is increased by about 10%, compared with that with the conventional construction.

In Embodiments 6 and 7 described above, semiconductor layers are stacked in the order of NPNP on an N-type semiconductor substrate. Needless to say, this invention can be applied to a construction where semiconductor layers are stacked in the order of PNPN on a P-type semiconductor layer. In this case, the type of electrode provided on the uppermost N-type semiconductor layer is a cathode electrode, while that provided on the rear surface of the P-type semiconductor layer is an anode electrode.

Furthermore, a semiconductor layer of the same conducting type as the semiconductor substrate is stacked immediately above the semiconductor substrate in the above embodiments for the following reason. In general, when a PN (or NP) junction is formed on the surface of a semiconductor substrate, the poor crystallinity of the formed semiconductor layer tends to degrade the properties of the device. This is because when a crystal layer is epitaxially grown on a substrate surface, the crystallinity near the substrate surface is degraded compared with the crystallinity after the crystal layer has been grown above a certain level. The above problem can be solved by first forming the same semiconductor layer as the semiconductor substrate, and then forming the PN (or NP) junction. It is therefore desirable to interpose the semiconductor layer therebetween.

Embodiment 8

This embodiment is a self-scanning light-emitting device disclosed by the present applicant in Japanese Laid-Open Patent Publication No. Hei-1(1989)-238962, representing an example to which the surface light-emitting thyristor of the present invention can be applied.

Figure 10:
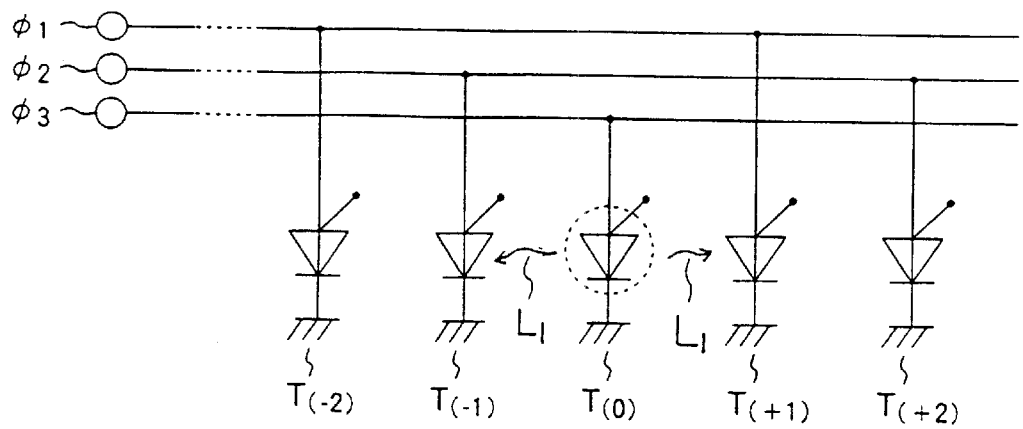
FIG. 10 is an equivalent circuit diagram of a self-scanning type light-emitting device using the light-emitting elements this invention in Embodiment 8.

FIG. 10 shows an equivalent circuit diagram of assistance in explaining the operating principle of the self-scanning type light-emitting device of this embodiment. This represents the case where the aforementioned surface light-emitting thyristor(hereinafter referred to simply as light-emitting thyristor) of this invention is used as a light-emitting thyristor whose light-emitting threshold voltage and current can be controlled externally.

Light-emitting thyristors T(−2)–T(+2) are arranged in a line. Each of three transfer clock lines ($\phi_1$, $\phi_2$ and $\phi_3$) is connected to the anode electrode of each light-emitting thyristor (in a repeated manner) at intervals of three elements. The light-emitting thyristor generally has such a characteristic that the turn-on voltage thereof is lowered as light is detected. When the light-emitting thyristors are constructed so that the light emitted by light-emitting thyristors is incident upon mutual elements, the turn-on voltage of the element nearest to the light-emitting thyristor, or the element arranged so as to receive light best, lowers.

The operation of the equivalent circuit shown in FIG. 10 will be described in the following. Assume that a high-level pulse voltage is applied to the transfer clock line $\phi_3$ and the light-emitting thyristor T(0) is in the ON state. The light $L_1$ emitted by the light-emitting thyristor T(0) is incident upon the adjacent light-emitting thyristors T(−1) and T(+1) causing their turn-on voltage to lower. Since the light-emitting thyristors T(−2) and T(+2) are located farther compared with the light-transmitting thyristors T(−1) and T(+1) the incident light on them is too weak to decrease the turn-on voltage materially.

In this state, a high-level pulse voltage is applied to the clock line $\phi_1$. The turn-on voltage of the light-emitting thyristor T(+1) lowers compared with the turn-on voltage of the light-emitting thyristor T(−2) due to the effect of light, with the consequence that when the high-level voltage of transfer clock is set at a voltage between the ON voltage or the light-emitting thyristor T(+1) and the ON voltage of the light-emitting thyristor T(−2), only the light-emitting thyristor T(+1) is turned on and the light-emitting thyristor T(−2) is not turned on.

Consequently, a situation where both the light-emitting thyristors T(+1) and T(0) are turned on simultaneously. When the voltage of the clock line $\phi_3$ is lowered to a low-level voltage, the light-emitting thyristor T(0) is turned off and only the light-emitting thyristor T(+1) is turned on. Thus, the ON state is transferred.

If the high-level voltages on the transfer clock lines $\phi_1$, $\phi_2$ and $\phi_3$ are set so that they are sequentially overlapped slightly with each other, based on the aforementioned principle, the ON state of the light-emitting thyristor is sequentially transferred. That is, the light-emitting point is sequentially transferred and a self-scanning type light-emitting device is realized.

Next, the method of manufacturing through integration the self-scanning type light-emitting device of this embodiment will be described.

Figure 11:
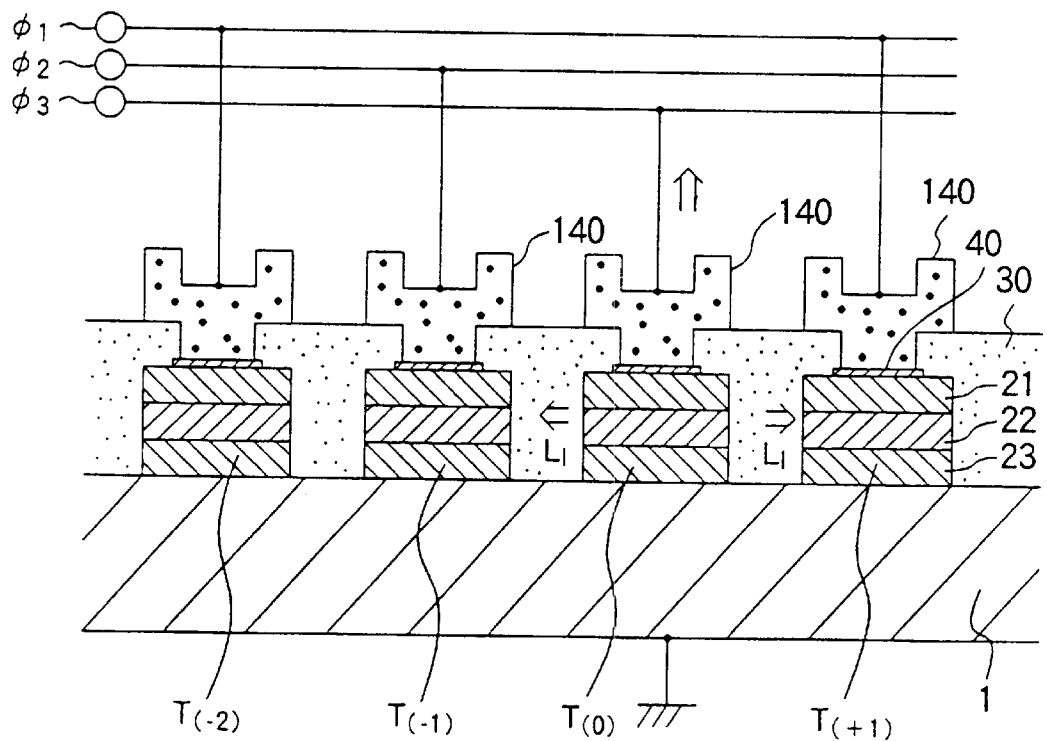
FIG. 11 is a cross-sectional view illustrating an outline the self-scanning type light-emitting device of Embodiment 8 of this invention.

A schematic cross-sectional view of the self-scanning type light-emitting device of this embodiment is shown in FIG. 11. A P-type semiconductor layer 23, N-type semiconductor layer 22 and P-type semiconductor layer 21 are formed on a grounded N-type GaAs substrate 1, and separated into individual light-emitting thyristors T(−2)–T(+1) using photolithography, etching and other techniques. An anode electrode 40 makes ohmic contact with the P-type semiconductor layer 21, and an insulating layer 30 serves as a protective film to prevent the shortcircuiting of elements and wirings and to prevent the degradation of characteristics. In this embodiment, a material that transmits the light of the wave length of the light emitted by the light-emitting thyristors is used for the insulating layer 30. The anode electrode 40 is connected to a wiring 140 via a contact hole provided on the insulating layer.

The P-type semiconductor layer 21 is the anode of this thyristor and the N-type GaAs substrate 1 is the cathode thereof. Each of three transfer clock lines ($\phi1$, $\phi2$ and $\phi_3$) is connected to the anode electrode 40 of each light-emitting thyristor at intervals of three elements.

As described above, it is generally known that the turn-on voltage of the light-emitting thyristor varies depending on the amount of light incident upon the element. Consequently, if it is constructed so that part of the light emitted by the turned-on light-emitting thyristor is incident upon the adjacent light-emitting thyristor, the ON voltage of the light-emitting thyristor near the turned-on light-emitting thyristor lowers compared with the case where there is no light.

With the construction shown in FIG. 11 where the insulating layer 30 is made of a transparent film with respect to the wave length of the light emitted, the light can easily enter into the adjacent element, causing the turn-on voltage thereof to lower.

The constructions described with reference to Embodiments 1 through 5 can be applied to the anode electrode of the light-emitting thyristor of the self-scanning type light-emitting device of this embodiment. Furthermore, the constructions described in Embodiments 6 and 7 may be used for the construction of the semiconductor layers of the light-emitting thyristors used in the self-scanning type light-emitting device of this embodiment.

Embodiment 9

The self-scanning type light-emitting device of this embodiment uses electrical potential as a medium of interaction between light-emitting thyristors. That is, this embodiment uses potential coupling while the aforementioned Embodiment 8 uses optical coupling.

Figure 12:
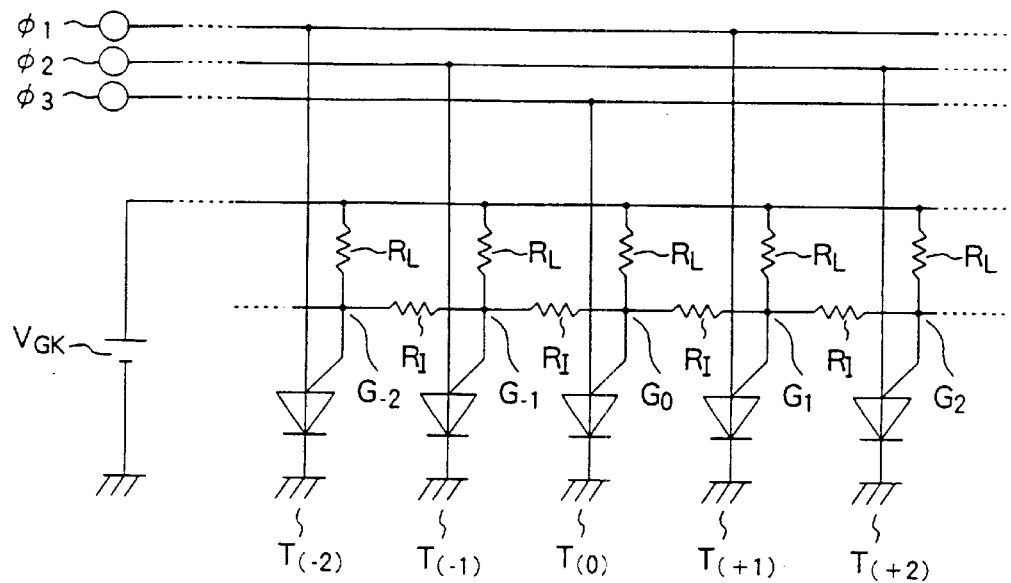
FIG. 12 is an equivalent circuit diagram of a self-scanning type light-emitting device using the light-emitting thyristors of this invention in Embodiment 9.

As a specific example, an equivalent circuit diagram of the self-scanning type light-emitting device of this embodiment is shown in FIG. 12. This light-emitting device is characterized by the construction where a resistor network is added to Embodiment 8, that is, the circuit shown in FIG. 10.

As light-emitting elements, surface light-emitting thyristors T(−2)–T(+2) according to this invention are used, and gate electrodes $G_{-2}$–$G_{+2}$ are provided on the light-emitting thyristors T(−2)–T(+2) respectively. Bias voltage $V_{GK}$ is applied to the gate electrodes via load resistors $R_L$. The gate electrodes $G_{-2}$–$G_{+2}$ are electrically connected to each other via resistors $R_1$ to obtain interaction. Each of three transfer clock lines ($\phi_1$, $\phi_2$ and $\phi_3$) is connected to the anode electrode of each light-emitting thyristor at intervals of three elements (in a repeated manner).

Now, the operation of this embodiment will be described. Assume that the transfer clock $\phi_3$ is at a high level, and the light-emitting thyristor T(0) is turned on. At this time, the potential of the gate electrode $G_0$ is lowered to a level near zero volts due to the characteristic of the three-terminal thyristor. Assuming that the bias voltage $V_{GK}$ is 5 volts, the gate voltage of each light-emitting thyristor is determined by the network of the load resistor $R_L$ and the interactive resistor $R_I$. And the gate voltage of an element near the light-emitting thyristor T(0) lowered most, and the gate voltage of each subsequent element rises as it is remote from T(0). This can be expressed as follows:

$$V_{G0} < V_{G1} = V_{G-1} < V_{G2} = V_{G-2} \tag{1}$$

The difference among these voltages can be set by properly selecting the values of the load resistor $R_L$ and the interactive resistor $R_1$.

It is known that the turn-on voltage $V_{ON}$ on the anode side of the three-terminal thyristor is a voltage that is higher than the gate voltage by the diffusion potential $V_{dif}$ of the PN Junction.

$$V_{ON} \approx V_G + V_{dif} \tag{2}$$

Consequently, by setting the voltage applied to the anode to a level higher than this turn-on voltage VON, the light-emitting thyristor is turned on.

Now, in the state where the light-emitting thyristor T(0) is turned on, a high-level voltage $V_H$ is applied to the next transfer clock pulse$\phi_1$. Although this clock pulse $\phi_1$ is applied to the light-emitting thyristors T(+1) and T(−2) simultaneously, only the light-emitting thyristor T(+1) can be turned on by setting the high-level voltage $V_H$ value to the following range.

$$V_{G-2} + V_{dif} > V_H > V_{G+1} + V_{dif} \tag{3}$$

By doing this, the light-emitting thyristors T(0), T(+1) are turned on simultaneously. When the high-level voltage of the clock pulse $\phi_3$ is cut off, the light-emitting thyristor T(0) is turned off, and this completes a transfer in the ON state.

In this way, this embodiment makes it possible to provide a transfer function to a light-emitting thyristor by connecting the gate electrodes of the light-emitting thyristors with a resistor network.

Based on the principle described above, the ON state of the light-emitting thyristor is sequentially transferred by setting the high-level voltages of the, transfer clocks $\phi_1$, $\phi_2$ and $\phi_3$ in such a manner as to overlap sequentially and slightly with each other. That is, the self-scanning type light-emitting device is accomplished as the light-emitting point is sequentially transferred.

Next, the method of manufacturing through integration the self-scanning type light-emitting device of this embodiment will be described.

Figure 13:
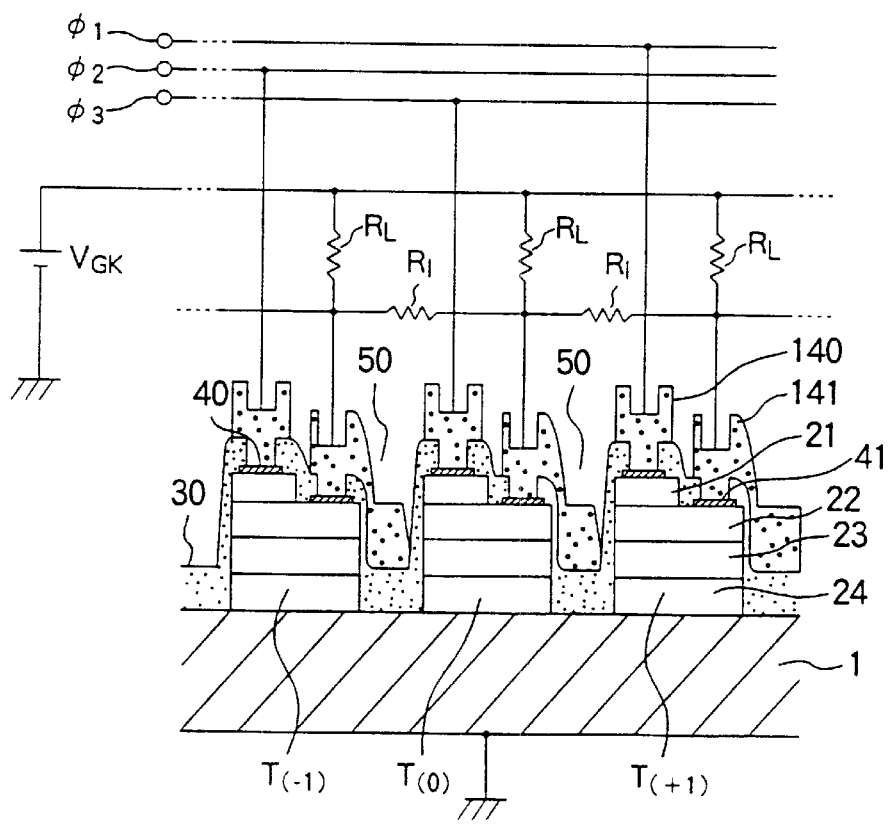
FIG. 13 is a cross-sectional view illustrating an outline of the self-scanning type light-emitting device of Embodiment 9.

A schematic cross-sectional view of the self-scanning type light-emitting device of this embodiment is shown in FIG. 13. An N-type semiconductor layer 24, P-type semiconductor layer 23, N-type semiconductor layer 22 and P-type semiconductor layer 21 are formed on a grounded N-type GaAs substrate 1, and separated into individual light-emitting thyristors $T(-1)-T(+1)$ with photolithography, etching and other techniques. Numeral 50 refers to a separating groove. The anode electrode 40 makes ohmic contact with the P-type semiconductor layer 21, and the gate electrode 41 makes ohmic contact with the N-type semiconductor layer 22.

An insulating layer 30 serves as a protective film to prevent the shortcircuiting of elements and wirings and prevent the degradation of characteristics. The anode electrode 40 and the gate electrode 41 are connected to the wirings 140 and 141 via a contact hole provided in the insulating layer 30.

The N-type GaAs substrate 1 serves as the cathode of this thyristor. Each of three clock lines ($\phi_1$, $\phi_2$ and $\phi_3$) is connected to the anode electrode 40 of each light-emitting thyristor at intervals of three elements. A resistor network of a load resistor $R_L$ and an interactive reactor $R_I$. is connected to the gate electrode 41.

In this state, when an optical coupling as described in Embodiment 8 takes place, the transferring operation of the light-emitting thyristor array of this embodiment could be adversely affected. To prevent such optical coupling, the self-scanning type light-emitting device of this embodiment has such a construction that part of the gate electrode 41 is included in the separating groove 50 between the light-emitting thyristors.

The construction described in Embodiments 1–5 can be applied to the anode electrode portion of the light-emitting thyristor used in the self-scanning type light-emitting device of this embodiment. Furthermore, the construction described in Embodiments 6 and 7 can be applied to that of the semiconductor layers of the light-emitting thyristors used in the self-scanning light-emitting device of this embodiment.

Embodiment 10

This embodiment is the self-scanning type light-emitting device disclosed by the present applicant et al. in Japanese Laid-Open Patent Publication No. Hei-2(1989)-14584, representing is one of the examples to which the afoementioned surface light-emitting thyristor can be applied.

Figure 14:
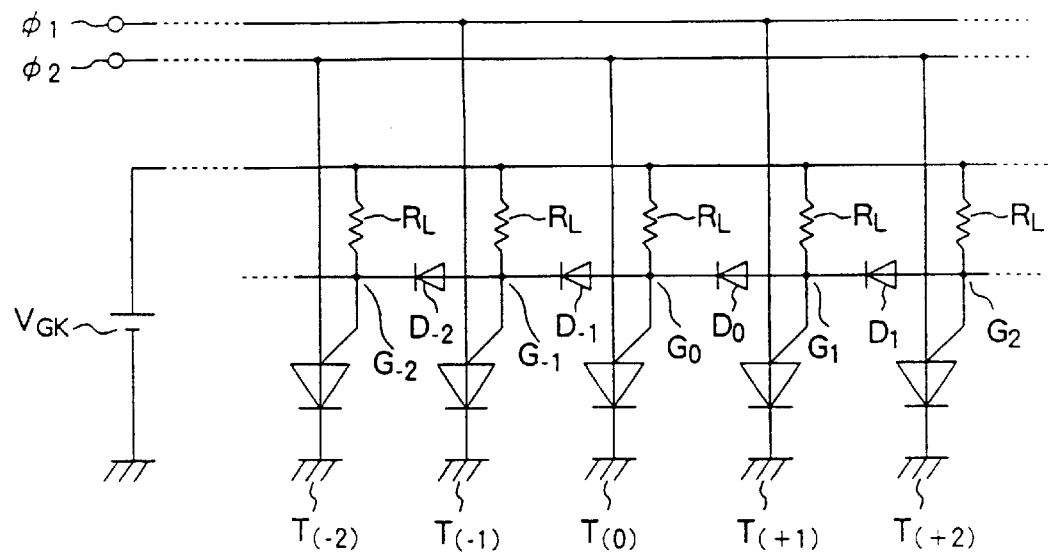
FIG. 14 is an equivalent circuit diagram of a self-scanning type light-emitting device using the light-emitting thyristors of this invention in Embodiment 10.

In this embodiment, an example of using a diode as a method of electrical connection will be described. An equivalent circuit diagram of assistance in explaining the principle of the self-scanning type light-emitting device of this embodiment is shown in FIG. 14 where the three-terminal light-emitting thyristor of this invention is used as a light-emitting thyristor whose light-emitting threshold voltage and current can be controlled externally. The light-emitting thyristors $T(-2)-T(+2)$ are arranged in a line. $G_{+2-G-2}$ denote gate electrodes of the light-emitting thyristors $T(-1)$ $T(+2)$ respectively. $R_L$ denotes a load resistance of the gate electrode, and $D_{-2-D+2}$ denote diodes that carry out electrical interaction. $V_{GR}$ denotes a bias voltage. Each of two transfer clock lines ($\phi_1$ and $\phi_2$) is connected to the anode electrode of each light-emitting thyristor on every other element.

Now, the operation will be described. Assume that as the transfer clock $\phi_2$ is shifted to a high level, the light-emitting thyristor T(0) is turned on. At this time, the voltage of the gate electrode G. is reduced to a level near zero volts due to the characteristic of the three-terminal thyristor. Assuming that the bias voltage $V_{GK}$ is 5 volts, the gate voltage of each light-emitting thyristor is determined by the network of the diodes $D_{-2-D+2}$. The gate voltage of an element nearest to the light-emitting thyristor T(0) drops most, and the gate voltages of other elements rise as they are farther away from T(0).

The voltage reducing effect works only in the rightward direction from T(0) due to the unidirectionality and asymmetry of diode characteristics. That is, the gate electrode $G_1$ is set at a higher voltage with respect to $G_0$ by a forward rise voltage $V_{dif}$ (equal to the diffusion potential of the PN junction) of the diode, while the gate electrode $G_2$ is set at a higher voltage with respect to $G_1$ by a forward rise voltage $V_{dif}$ of the diode. On the other hand, current does not flow in the gate electrode $G_{-1}$ on the left side of T(0) because the diode $D_{-1}$ is reverse-biased. As a result, the gate electrode $G_{-1}$ is at the same potential as the bias voltage $V_{GK}$.

Although the next transfer clock pulse $\phi_1$ is applied to the nearest light-emitting thyristors T(1), T(-1), and T(3) and T(-3), the element having the lowest turn-on voltage among them is T(1), whose turn-on voltage is approximately the gate voltage of $G_1+V_{dif}$, about twice as high as $V_{dif}$. The element having the second lowest turn-on voltage is T(3), about four times as high as $V_{dif}$. The ON voltage of T(-1) and T(-3) is about $V_{GK}+V_{dif}$.

It follows from the above discussion that by setting the high-level voltage of the transfer clock pulse to a level about twice to four times as high as $V_{dif}$, only the light-emitting thyristor T(1) is turned on to perform a transfer operation.

Figure 15:
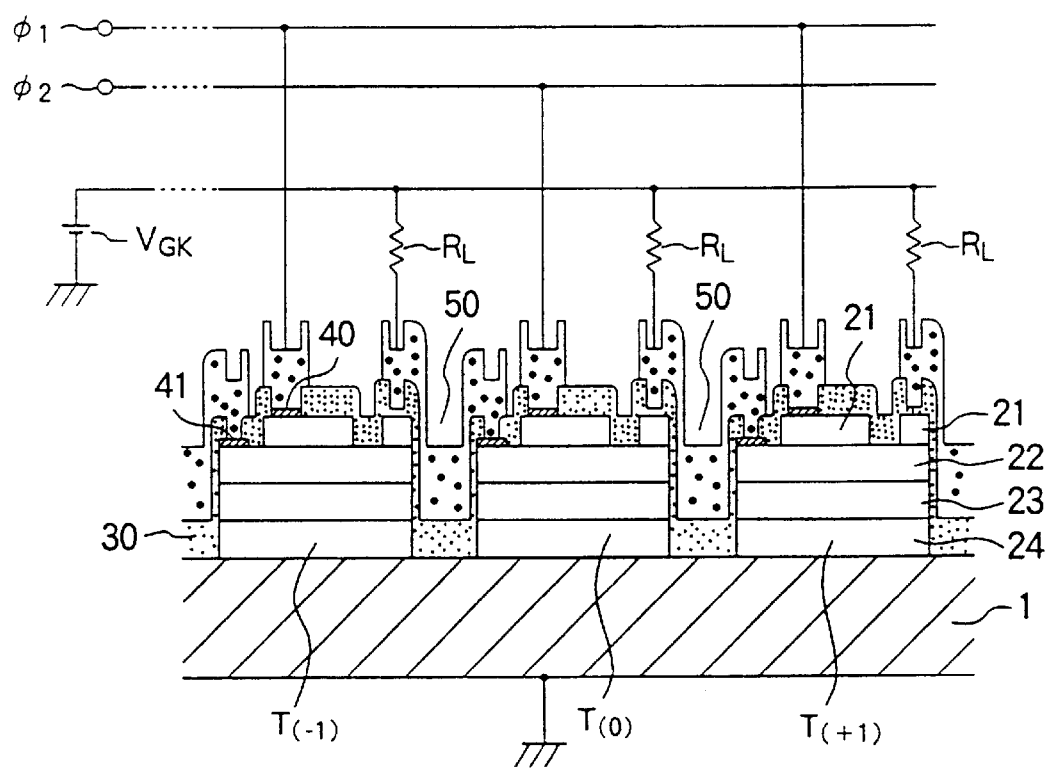
FIG. 15 is a cross-sectional view illustrating the construction of the self-scanning type light-emitting device of Embodiment 10.

Next, the method of manufacturing through integration the self-scanning type light-emitting device of this embodiment will be described. A schematic cross-sectional view of the light-emitting device of this embodiment is shown in FIG. 15. An N-type semiconductor layer 24, P-type semiconductor layer 23, N-type semiconductor layer 22 and P-type semiconductor layer are formed on a grounded N-type GaAs substrate 1, and separated into individual light-emitting thyristors $T(-2)-T(+1)$. A separating groove is indicated by numeral 50. The anode electrode 40 makes ohmic contact with the P-type semiconductor layer 21, and the gate electrode 41 makes ohmic contact with the N-type semiconductor layer 22. An insulating layer 30 serves as a protective film to prevent the short-short-circuiting of elements and wirings, and prevent the degradation of characteristics. The insulating layer 30 is made of a material that does not transmit the light of the wave length of that emitted by the light-emitting thyristor.

The N-type GaAs substrate 1 works as a cathode. Each of two transfer clock lines ($\phi_1$ and $\phi_21$) is connected to the anode electrode of each light-emitting thyristor on every other element.

By setting the high-level voltage of the transfer clocks $\phi_1$ and $\phi_2$ in such a manner as to overlap alternately and slightly with each other, the ON state of the light-emitting thyristor is sequentially transferred, that is, the light-emitting point is sequentially transferred. Thus, the integrated self-scanning type light-emitting device using potential coupling by diode can be accomplished.

The construction described in Embodiments 1–5 can be applied to the anode electrode portion of the light-emitting thyristors used in the self-scanning type light-emitting device of this embodiment. Furthermore, the construction described in Embodiments 6 and 7 can also be applied to the construction of the semiconductor layers of the light-emitting thyristors used in the self-scanning type light-emitting device of this embodiment.

Embodiment 11

Figure 16:
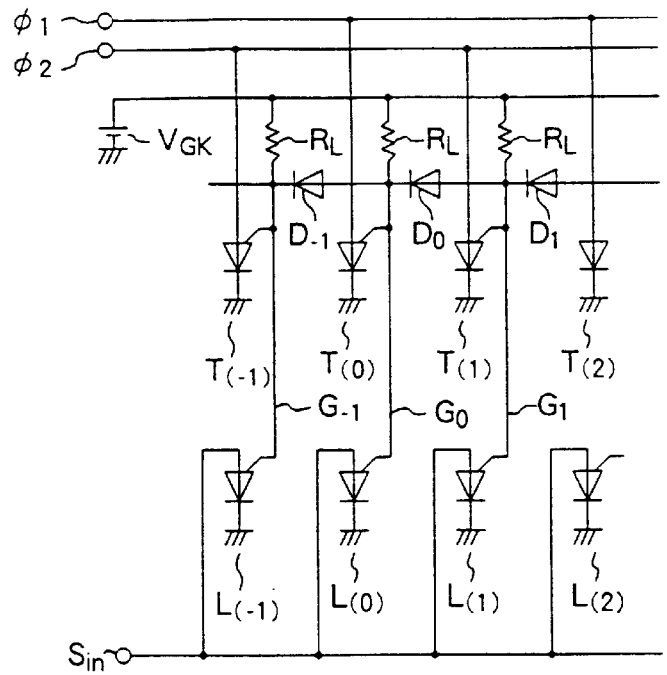
FIG. 16 is an equivalent circuit diagram of a self-scanning type light-emitting device using the light-emitting thyristors of this invention in Embodiment 11.

This embodiment is the self-scanning type light-emitting device disclosed by the present applicant et al. in Japanese Laid-Open Patent Publication No. Hei-2(1989)-263668, representing one of the examples to which the surface light-emitting thyristor of this invention can be applied. An equivalent circuit diagram of assistance in explaining the principle of the self-scanning type light-emitting device of this invention is shown in FIG. 16.

This self-scanning type light-emitting device comprises switching element T(-1)–T(2), and writable light-emitting elements L(-1)–L(2). The construction of switching elements is similar to that of diode connection described earlier. The gate electrodes $G_{-1-G1}$, of the switching elements are also connected to the gates of the writable light-emitting elements. A write signal $S_{in}$ is applied to the anode of the writable light-emitting element.

Figure 17:
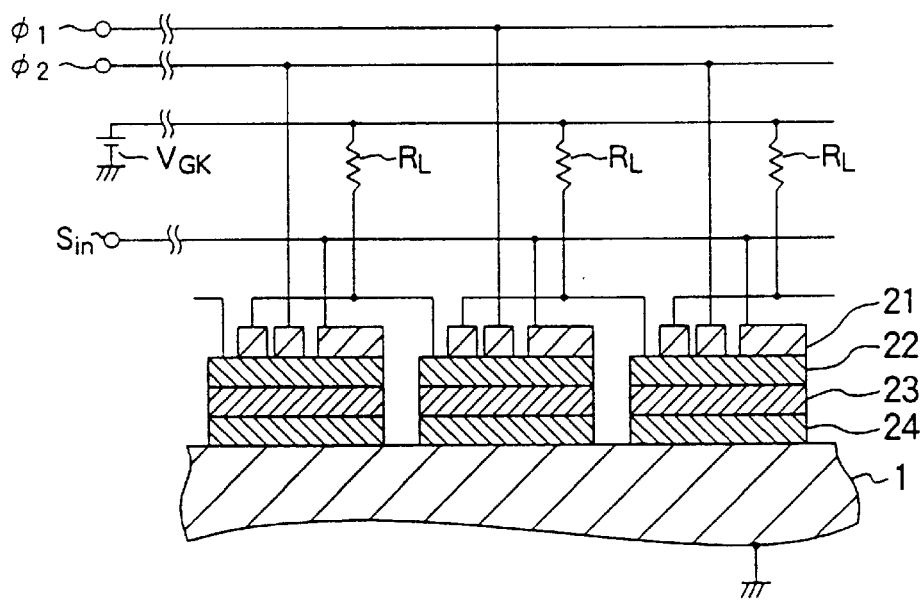
FIG. 17 is a schematic cross-sectional view of the self-scanning type light-emitting device of FIG. 16.

In the following, the operation of this self-scanning type light-emitting device will be described. A schematic cross-sectional view of the device is shown in FIG. 17, in which N-type semiconductor layer 24, P-type semiconductor layer 23, N-type semiconductor layer 22 and P-type semiconductor layer are formed on a grounded N-type GaAs substrate 1. Assuming that the switching element T(0) is in the ON state, the voltage of the gate electrode Go lowers below $V_{GK}$ (which is assumed to be 5 volts) and to almost zero volts. Consequently, if the voltage of the write signal $S_{in}$, is higher than the diffusion potential (about 1 volt) of the PN junction, the light-emitting element L(0) can be turned into a light-emission state.

On the other hand, the voltage of the gate electrode G–1, is approximately 5 volts, and the voltage of the gate electrode $G_1$, is about 1 volt. Consequently, the write voltage of the light-emitting element L(-1) is about 6 volts, and the write voltage of the light-emitting element L(1) is about 2 volts. It follows from this that the voltage of the write signal $S_{in}$ that can write only in the light-emitting element L(0) is a range of about 1–2 volts. When the light-emitting element L(0) is turned on, that is, in the light-emitting state, the voltage of the write signal Si, line is fixed at about 1 volt. Thus, an error of selecting other light-emitting elements can be prevented.

Light-emitting intensity is determined by the amount of current fed to the write signal $S_{in}$, and an image can be written at any desired intensity. In order to transfer the light-emitting state to the next element, it is necessary to first turn off the element that is emitting light by temporarily reducing the voltage of the write signal $S_{in}$ line down to zero volts.

The construction described in Embodiments 1–5 can be applied to the anode electrode portions of the light-emitting element used in the self-scanning type light-emitting device of this embodiment. Moreover, the construction described in Embodiments 6 and 7 can be applied to the construction of semiconductor layers of the light-emitting elements used in the self-scanning type light-emitting device of this embodiment. Switching elements may be of the construction described in embodiments 1–7, similar to light-emitting elements.

Embodiment 12

Figure 18:
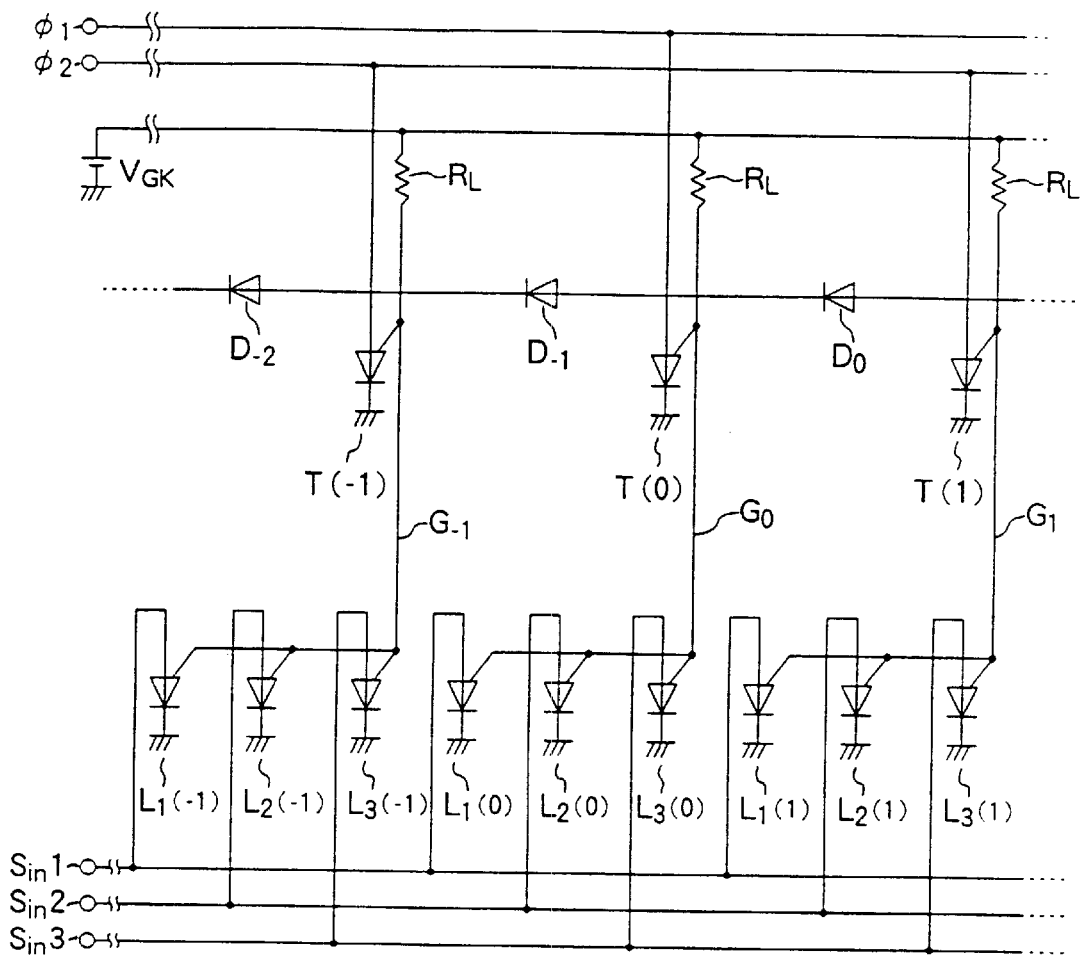
FIG. 18 is an equivalent circuit diagram of a self-scanning type light-emitting device using the light-emitting thyristors of this invention in Embodiment 12.

This embodiment is the self-scanning type light-emitting device in which a plurality of light-emitting elements can emit light. An equivalent circuit diagram of this self-scanning type light-emitting device is shown in FIG. 18.

What is different in this device from the circuit shown in FIG. 16 is that light-emitting elements are grouped into three-element blocks, and the light-emitting elements in a block are controlled by a single switching element, and the light-emitting elements in a block are connected to separate write signal lines $S_{in}1$, $S_{in}2$ and $S_{in}3$ to control the light emission of the elements. In the figure, the light-emitting elements $L_1(-1)$, $L_2(-1)$ and $L_3(-1)$, the light-emitting elements $L_1(0)$, $L_2(0)$ and $L_3(0)$, and the light-emitting elements $L_1(1)$, $L_2(1)$ and $L_3(1)$ denote the light-emitting elements that are grouped into blocks.

The operation of this embodiment is the same as that of the circuit shown in FIG. 16 except that light emission is written into a plurality of light-emitting elements by $S_{in}$, simultaneously and transferred to each block, whereas light emission is written into elements one by one with $S_{in}$.

If this self-scanning type light-emitting device is used as a light source for generally known optical printers such as ED printers, about 3400 bits of light-emitting elements are required to print a copy equivalent to a short side (about 21 cm) of a paper sheet of standard A4 size at a resolution of 16 dots/mm.

In the self-scanning type light-emitting device described in Embodiment 11, the number of light-emitting points is invariably one, while in the above embodiment, an image can be written by varying the intensity of light emission. If an optical printer is assembled using this device, a luminance 3400 times as high as that needed for commonly used optical printer LED arrays (that is controlled by a driving IC so that LEDs corresponding to points at which an image is written emit light simultaneously) is required in writing an image. This means that with the same light emission efficiency, a current 3400 times as high is needed. The light emission time, however, will be reduced to 1/3400 compared with that required for commonly used LED arrays.

The service life of the light-emitting element, however, usually tends to be reduced with increases in current. The light-emitting element therefore has a drawback of reduced service life, compared with the conventional LED printer, that cannot be offset by the advantage that its duty cycle can be reduced to 1/3400.

When compared with the same number of bits, however, the self-scanning type light-emitting device of this embodiment in which three elements are grouped in a block has light-emission time three times as long as that for the self-scanning type light-emitting device described in Embodiment 11. Consequently, the current fed to the light-emitting element of the ON state can be reduced to 1/3, resulting-in longer service life compared with Embodiment 11.

Although three elements are included in a block in this embodiment, the larger the number of elements in a block the lower current is needed to write, thus contributing to extended service life.

The construction described in Embodiments 1–5 can be applied to the anode electrode portion of the light-emitting elements used in the self-scanning type light-emitting device of this embodiment. Moreover, the construction described in Embodiments 6 and 7 can be applied to the construction of the semiconductor layers of the light-emitting elements used in the self-scanning type light-emitting device of this embodiment. Switching elements may be of the construction described in embodiments 1–7, similar to light-emitting elements.

Embodiment 13

Figure 19:
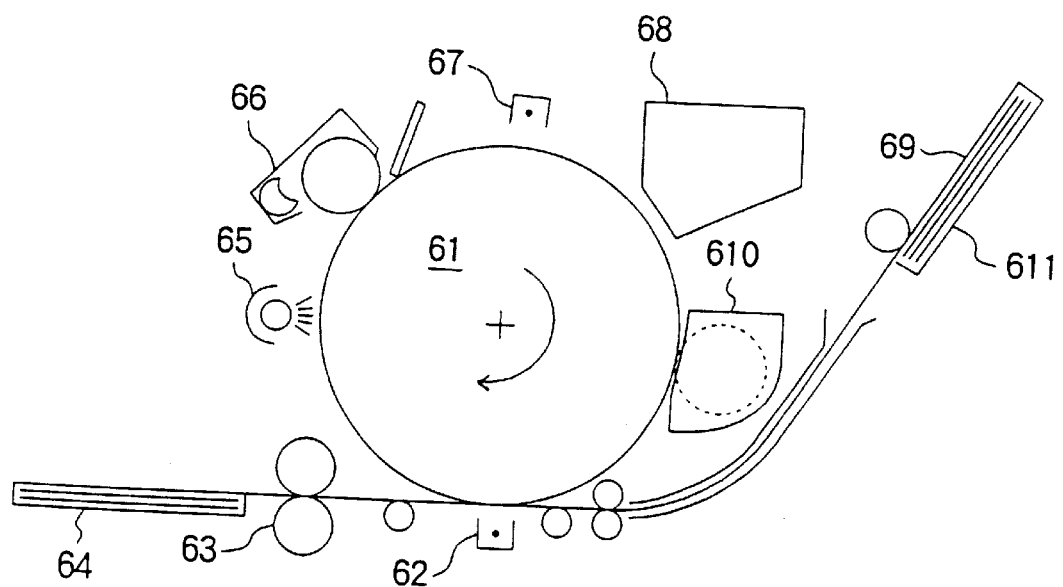
FIG. 19 is a diagram illustrating an optical printer.

The application of the self-scanning type light-emitting device of this invention to an optical printer will be described in the following. An example where modules of picture elements of LED arrays connected to a driving IC are applied to an optical printer is heretofore known. The operating principle of an optical printer is shown in FIG. 19. An optically conductive material (photosensitive material) such as amorphous Si is provided on the surface of a cylindrical photoconductor drum 61, which is rotated at the printing speed. The surface of the photosensitive material is uniformly charged with an electrostatic charger 67. Then, light arrays corresponding to a dot image being printed with a light-emitting element array optical print head 68 are radiated onto the surface of the photosensitive material to neutralize the charge on the area to which the light arrays are radiated. Next, a developer deposits the tone on the photosensitive material surface in accordance with the charged pattern on the photosensitive material surface. The transfer unit 62 transfers the toner on a paper sheet 69 fed from a cassette 611. The toner on the paper sheet is thermally fixed by the heat applied by a fixer 63. Upon completion of transfer, on the other hand, the charge on the drum is neutralized over the entire surface with an erasing lamp 65, and the remaining toner is removed by a cleaner 66.

Figure 20:
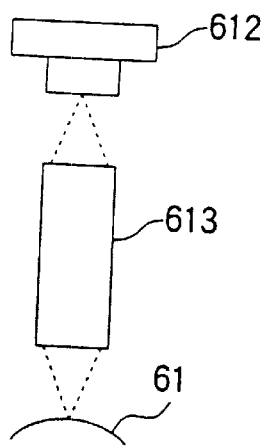
FIG. 20 is a diagram illustrating a combination of a light-emitting element module and a rod-lens array.

Now, a light-emitting element array module manufactured by arranging the self-scanning type light-emitting devices in a straight line on a predetermined substrate is applied to an optical print head. The construction of the optical print head is shown in FIG. 20. This optical print head comprises a light-emitting array 612 and a rod-lens array 613, and the lens is adapted so as to focus on the photoconductor drum 61. Image information can be written with the light from this light-emitting element array module.

INDUSTRIAL APPLICABILITY

This invention makes it possible to provide a surface light-emitting element having good external light emission efficiency. A self-scanning type light-emitting device using this surface light-emitting element has improved external light emission efficiency and requires no driving circuit, thus achieving a low-cost optical print head for optical printers. When the self-scanning type light-emitting device using this surface light-emitting element is applied to a printing device, high-quality printing can be accomplished because each light-emitting element has improved external light emission efficiency.

What is claimed is:

1. A surface light-emitting thyristor comprising a first semiconductor layer of a first conductivity type a second semiconductor layer of a second conductivity type, a third semiconductor layer of the second conductivity type and a fourth semiconductor layer of the first conductivity type stacked in that order on a substrate of the first conductivity type, a first electrode provided on said fourth semiconductor layer, a second electrode provided on said third semiconductor layer, and a third electrode provided on a rear surface of said substrate, characterized in that:

said first, second and third semiconductor layers have necked portions between a region of said first electrode and a region of said second electrode.

2. A surface light-emitting thyristor comprising a first semiconductor layer of a first conductivity type, a second semiconductor layer of a second conductivity type, a third semiconductor layer of the first conductivity type and a fourth semiconductor layer of the second conductivity type stacked in that order on a substrate of the first conductivity type, a first electrode provided on said fourth semiconductor layer, a second electrode provided on said third semiconductor layer, and a third electrode provided on a rear surface of said substrate, characterized in that:

said third semiconductor layer has a groove between a region of said first electrode and a region of said second electrode to increase a resistance value between said regions, the groove having sides and a bottom all within said third semiconductor layer.

3. A surface light-emitting thyristor comprising a second semiconductor layer of a second conductivity type, a third semiconductor layer of a first conductivity type and a fourth semiconductor layer of the second conductivity type stacked in that order on a substrate of the first conductivity type, a first electrode provided on said fourth semiconductor layer, a second electrode provided on said third semiconductor layer, and a third electrode provided on a rear surface of said substrate, characterized in that:

said second and third semiconductor layers have necked portions between a region of said first electrode and a region of said second electrode.

4. A surface light-emitting thyristor comprising a second semiconductor layer of a second conductivity type, a third semiconductor layer of a first conductivity type and a fourth semiconductor layer of the second conductivity type stacked in that order on a substrate of the first conductivity type, a first electrode provided on said third semiconductor layer, and a third electrode provided on a rear surface of said substrate, characterized in that:

said third layer has a groove between a region of said first electrode and a region of said second electrode to increase a resistance value between said regions, the groove having sides and a bottom all within said third layer.

5. A surface light-emitting thyristor as set forth in any of claims 1–4 further comprising:

wiring connected to said first electrode, the wiring being provided over said fourth semiconductor layer;

wherein said first electrode is expanded to a region not covered by said wiring on said fourth semiconductor layer; and an insulating layer provided between a portion of said first electrode covered by said wiring and said fourth semiconductor layer.

6. A surface light-emitting thyristor as set forth in any of claims 1–4, wherein said first electrode is of a slender shape and said surface light-emitting thyristor further comprising;

a first wiring connected to an end of said first electrode, a second wiring connected to an other end of said first electrode, a first insulating layer provided between a portion of said end of said first electrode covered by said first wiring and said fourth semiconductor layer, and a second insulating layer provided between a portion of said other end of said first electrode covered by said second wiring and said fourth semiconductor layer.

7. A surface light-emitting thyristor as set fourth in any of claims 1–4 wherein said first electrode is of a rectangular shape having four sides, and said surface light-emitting thyristor further comprising;
a wiring connected to said first electrode said wiring straddling one side of said first electrode, and
insulating layer provided between said first electrode and said fourth semiconductor layer in such a manner as to be inside of three sides excluding said one side, of said first electrode.

8. A surface light-emitting thyristor as set forth in any of claims 1–4, wherein said first electrode makes ohmic contact with said fourth semiconductor layer;
said surface light-emitting thyristor comprises a metallic layer that makes ohmic contact with said first electrode and Schottky contact with said fourth semiconductor layer, and a wiring connected to said metallic layer;
said first electrode extends to a region not covered by said wiring on said fourth semiconductor layer; and
current is injected into said fourth semiconductor layer from said metallic layer via said first electrode.

9. A surface light-emitting thyristor as set fourth in any of claims 1–4, wherein at least part of said first electrode is has an irregular peripheral planar shape.

10. A self-scanning type light-emitting device having such a construction that a plurality of light-emitting elements whose light emission start voltage varies with the intensity of light incident upon said elements are arranged, the light emitted by each light-emitting element is incident upon at least one light-emitting element located in the vicinity thereof, a plurality of wirings for applying voltage or current from the outside being connected to the electrodes for controlling the light emission of each light-emitting element, characterized in that:

said light-emitting element is a surface light-emitting thyristor as set forth in any of claims 1–4.

11. A self-scanning type light-emitting device having such a construction that a plurality of light-emitting elements each having a control electrode for controlling threshold voltage or current for light emission operation are arranged, said control electrodes of said light-emitting elements are connected to the control electrode of at least one light-emitting element located in the vicinity thereof via a connecting resistor or electrically unidirectional electrical element, and a plurality of wirings for applying voltage or current from the outside are connected to the electrodes for controlling the light emission of each light-emitting element, characterized in that:

said light-emitting element is a surface light-emitting thyristor as set forth in any of claims 1–4.

12. A self-scanning type light-emitting device comprising a self-scanning switching element array having such a construction that a plurality of switching elements each having a control electrode for controlling threshold voltage or current for switching operation are arranged, said control electrodes of said switching elements are connected to the control electrode of at least one switching element located in the vicinity thereof via a connecting resistor or electrically unidirectional electrical element, power-supply lines are connected to said switching elements by electrical means, and clock lines are connected to said switching elements, and a light-emitting element array in which a plurality of light-emitting elements each having a control electrode for controlling threshold voltage or current, the control electrodes of said light-emitting element array being connected to the control electrodes of said switching elements by electrical means, and lines for applying current for light emission to said light-emitting elements being provided, characterized in that:

said light-emitting element is a surface light-emitting thyristor as set forth in any of claims 1–4.

\* \* \* \* \*